United States Patent [19]
Hatsuda

[11] Patent Number: 5,671,181
[45] Date of Patent: Sep. 23, 1997

[54] DATA READ CIRCUIT USED IN SEMICONDUCTOR STORAGE DEVICE

[75] Inventor: Tsuguyasu Hatsuda, Osaka, Japan

[73] Assignee: Matsushita Electric Industrial Co., Ltd., Osaka, Japan

[21] Appl. No.: 573,146

[22] Filed: Dec. 15, 1995

[30] Foreign Application Priority Data

Dec. 16, 1994 [JP] Japan ................... 6-313400
Dec. 26, 1994 [JP] Japan ................... 6-322489

[51] Int. Cl.$^6$ ................................................ G11C 7/00
[52] U.S. Cl. .................. 365/189.05; 365/189.09; 365/189.11; 365/203
[58] Field of Search .................. 365/189.05, 189.09, 365/189.11, 203, 204, 205

[56] References Cited

U.S. PATENT DOCUMENTS 5,115,412  5/1992  Tobita ................... 365/189.09
5,408,438  4/1995  Tanaka et al. ........... 365/203

*Primary Examiner*—David C. Nelms
*Assistant Examiner*—Trong Quang Phan
*Attorney, Agent, or Firm*—McDermott, Will & Emery

[57] ABSTRACT

When a data is read out from a memory cell, a current mirror circuit is operated in response to detection of potential variation of a first data line, so that charge of a second data line is discharged by the current mirror circuit. At this point, a control transistor interposed between the first data line and the second data line is operated in a saturation region. As a result, the impedance between the first data line and the second data line becomes substantially infinity, and the two data lines are substantially open-circuited. Thus, the current mirror circuit discharges merely the second data line with a small load capacitance in a short period of time, resulting in a high speed read operation. Therefore, even when the first data line, to which a large number of memory cells are connected, has a large load capacitance, the read rate is increased.

17 Claims, 15 Drawing Sheets

300 INTERMEDIATE POTENTIAL GENERATION CIRCUIT

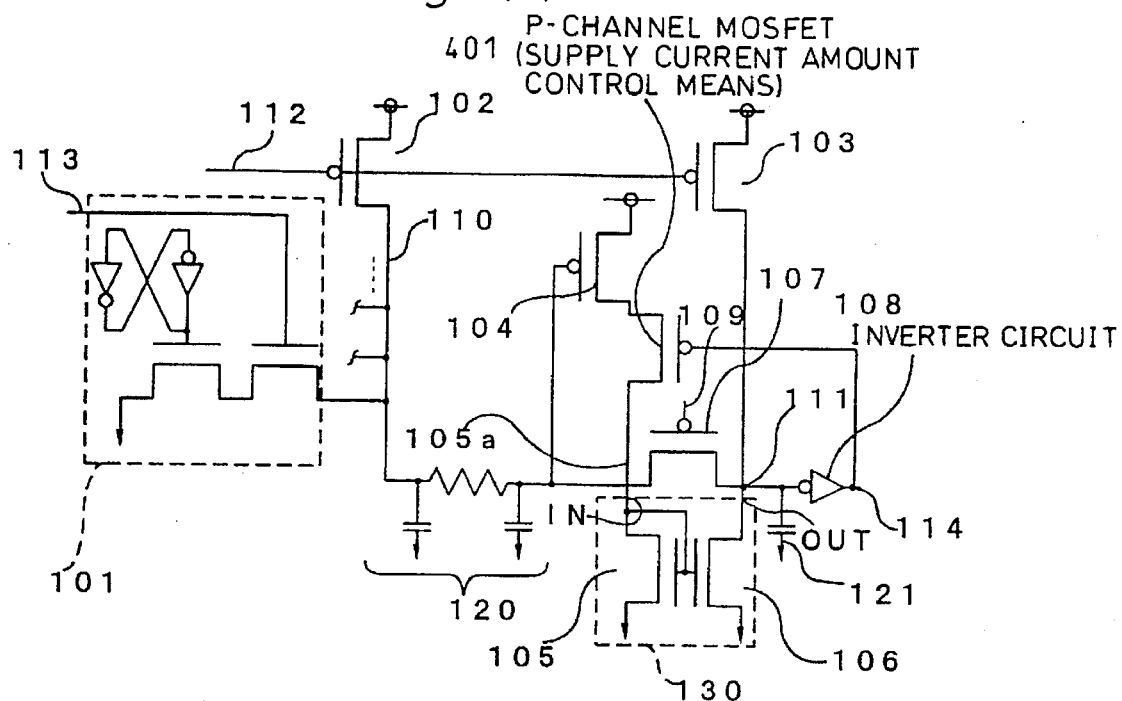
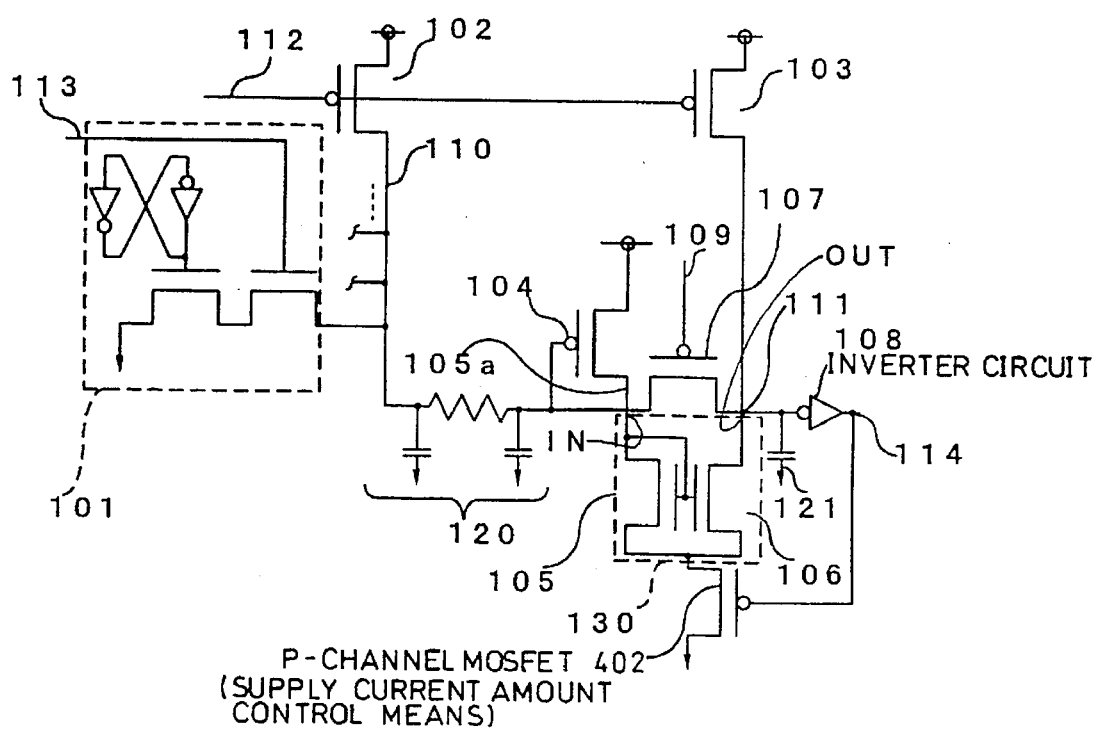

DATA READ CIRCUIT USED IN SEMICONDUCTOR STORAGE DEVICE

BACKGROUND OF THE INVENTION

The present invention relates to improvement of a data read circuit used in a semiconductor storage device, and more particularly it relates to increase of the data read rate.

A dynamic circuit has been used to construct a large scale circuit requiring a high speed operation such as a register file, a RAM, a ROM and a PLA.

A large scale built-in RAM has been used for a logic LSI such as a microprocessor, a microcontroller and a digital signal processor. A large scale built-in RAM is used, for example, as an on-chip cache in a microprocessor, as a RAM for storing a program and data in a communication LSI, and as a buffer RAM for data in a digital image processing LSI and a compressing/decompressing LSI. The RAM used in this manner comprises a read circuit using a latch type sense circuit for realizing a stable read operation and small power consumption.

Now, as examples of the data read circuit used in a conventional semiconductor storage device, a read circuit for a register file (i.e., a dynamic circuit) and a read circuit for a RAM using a latch type sense circuit will be described.

FIG. 9 is a circuit diagram of a conventionally used read circuit for a register file.

As is shown in FIG. 9, a memory cell 901 contained in a register file includes N-channel MOSFETs 901a and 901b and latch circuits 901c. A plurality of such memory cells 901 (merely one of which is shown in FIG. 9) are connected to a bit line 911, which is also connected to a precharge circuit 902 composed of a P-channel MOSFET for precharging the bit line 911 to a predetermined potential. An inverter 903 serves as a sense circuit.

In this read circuit, the precharge circuit 902 is turned on through a precharge enable line 912, thereby precharging the potential of the data line 911 to a supply voltage (hereinafter referred to as a high level). Then, a word line 913 of the memory cells is allowed to undergo a low to high transition. When the content of the memory cell 901 is, for example, at a high level, the charge of the data line 911 is discharged through the memory cell 901 so that the bit line 911 has a low potential (hereinafter referred to as a low level). When the content of the memory cell 901 is at a low level, the data line 911 remains at a high level because there is no discharge current path from the data line 911. Then, the potential of the data line 911 is logically inverted by the inverter 903, so that the obtained inverted signal is output to a sense output line 914. Thus, the content of the memory cell 901 is output.

FIG. 10 is a diagram of a read circuit disclosed in Japanese Laid-Open Patent Publication No. 4-217768 (corresponding to U.S. patent application No. 08/106,551) filed by the Applicant. This circuit comprises, in addition to the elements included in the circuit of FIG. 9, a P-channel MOSFET 951 for detecting the potential variation of a data line 961 and supplying a current, and a current mirror circuit 960 supplied with the current by the P-channel MOSFET 951 for discharging the charge of the data line 961. The current mirror circuit 960 includes two N-channel MOSFETs 952 and 953.

In the read operation of the read circuit of FIG. 10, the charge of the data line 961 is discharged through the memory cell 901, so as to decrease the potential of the data line 961. Then, the current mirror circuit 960 discharges the charge of the data line 961. Therefore, as compared with the circuit of FIG. 9, where the charge of the data line is discharged through the memory cell 901 alone, the discharge of the data line 961 is accelerated so as to increase the read rate.

FIG. 14 is a diagram showing the main part configuration of a conventional read circuit for a RAM using a latch type sense circuit.

The circuit of FIG. 14 comprises memory cell arrays 1401 and 1402 each covering a column of memory cells of the RAM. Each memory cell array includes a memory cell 1403 of the RAM, bit lines 1432 and 1433 for reading a data from and writing a data in the memory cell 1403, and a precharge circuit 1404 for precharging/equalizing the bit lines 1432 and 1433 in accordance with the potential of a precharge enable line PRC 1431.

The bit lines 1432 and 1433 are connected to a plurality of memory cells aligned in the row direction, which are omitted in FIG. 14 for simplification. Also, a word line WL 1430 is connected to a plurality of memory cells aligned in the column direction, which are also omitted in FIG. 14. A selector circuit 1405 selects the bit lines of one of the memory cell arrays 1401 and 1402 in accordance with the potential of a column address input line ADR 1434, on which a buffer circuit 1406 is disposed. Data lines 1435 and 1436 are connected to the bit line selected by the selector circuit 1405. The data line 1435 works as a read line for one bit of a data.

A latch type sense circuit 1407 comprises two inverters constructed with P-channel MOSFETs 1408 and 1409 and N-channel MOSFETs 1410 and 1411, and an N-channel MOSFET 1412 for current control. The sense circuit 1407 is controlled in accordance with the potential of a sense enable line SEN 1437.

A buffer circuit 1413 is used for writing a data in a memory cell. When a write enable line WEN 1439 is at a high level, a data input through an input line 1438 is written in the memory cell 1403 through the data line and the bit line.

As is shown in FIG. 14, the selector circuit 1405 is provided so as to select one pair of the bit line pairs for the purpose of (1) decreasing the circuit area and (2) decreasing power consumption. In other words, although a memory cell can be designed to have a small area by refining the process, a large area reduction ratio as that for a memory cell has not been achieved for a peripheral circuit such as a read circuit for increasing the operation speed. Therefore, each memory cell array being provided with one read circuit and one write circuit causes size unconformity. In order to avoid the size unconformity, the selector circuit for selecting one pair of the bit line pairs is provided. Furthermore, the power consumption can be effectively decreased by decreasing the number of the sense circuits 1407.

Now, the read operation of the RAM of FIG. 14 will be described referring to an operation timing chart of FIG. 15. In FIG. 15, waveforms of the potentials corresponding to the respective signal lines in the read circuit of FIG. 14 are referred to by the same reference numerals as those used in FIG. 14.

In the following description, it is assumed that the column address input line 1434 is set at a high level, and that the bit lines 1432 and 1433 of the memory cell array 1401 are selected by the selector circuit 1405. It is also assumed that the memory cell 1403 stores a logic value of "1".

When the potential of the word line 1430 is allowed to undergo a low to high transition at time t1, the potential of the bit line 1433 starts to be lowered to a low level through the memory cell 1403, and the bit line 1432 outputs a signal at a high level.

When a potential difference ΔVb1 between the two bit lines 1432 and 1433 becomes a predetermined potential at time t2, the potential of the sense enable line 1437 undergoes a low to high transition. At this point, the sense circuit 1407 works as a latch. Since the data lines 1435 and 1436 are respectively connected to the bit lines 1432 and 1433 via the selector circuit 1405, the potentials of data lines 1435 and 1436 changes in compliance with change in potentials of the bit lines 1432 and 1433. Specifically, when the potentials of the bit lines 1432 and 1433 and the data lines 1435 and 1436 are equal to each other, the sense circuit 1407 is balanced, and when a potential difference ΔVb1 occurs between the bit lines, the sense circuit 1407 amplifies this potential difference, so as to increase the potential of the bit line 1432 and the data line 1435 at a high level up to a supply voltage VDD and decrease the potential of the bit line 1433 and the data line 1436 at a low level down to a ground voltage VSS.

When the potential of the data line 1436 becomes lower than a logical threshold value at time t3, a data to be read is defined.

The potentials of the word line 1430, the precharge enable line 1431 and the sense enable line 1437 are operated at clock timing of substantially the same phase. Therefore, when the potential of the word line 1430 undergoes a high to low transition, the potentials of the precharge enable line 1431 and the sense enable line 1437 also undergo a high to low transition, and hence, the bit lines 1432 and 1433 and the data lines 1435 and 1436 are separated from the sense circuit 1407, and then, the bit lines 1432 and 1433 and the data lines 1435 and 1436 are precharged/equalized by the precharge circuit 1404.

In this manner, in the read circuit using the latch type sense circuit, when a potential difference occurs in the input line pair, the latch circuit is shifted from the balanced state to the unbalanced state so as to amplify the input potential difference. Therefore, such a read circuit can realize a stable read operation, and is used, in a wide range of application, as a read circuit for a built-in RAM in a logic LSI including a large scale logic circuit block. This read circuit is advantageous also in low power consumption because a through current flowing in the sense circuit in the read operation is small.

However, the circuit of FIG. 9 has a problem that a load 920 of the bit line 911 is extremely large and the read time is long. In particular, since the memory cell is constructed with a MOSFET having a small gate width for decreasing the area thereof, the drain capacitance of the memory cell is large. In addition, when a large number of memory cells are connected to the data line, the load 920 of the data line 911 is extremely increased. Accordingly, the discharge of the data line 911 requires a long time, resulting in further longer read time.

Also, in the circuit proposed by the Applicant shown in FIG. 10, since the charge of the data line is discharged also through the current mirror circuit 960, the read operation can be conducted faster than in the circuit of FIG. 9. However, since the magnitude of the discharge current of the MOSFET 953 in the current mirror circuit 960 is also limited, the effect to attain the short read time is eliminated when the load 920 of the data line 961 becomes large. In particular, when the circuit of FIG. 10 is used in a microprocessor or the like, large scale of the circuit increases the length of the data line, thereby increasing the resistance of the data line. As a result, the load capacitance of the data line is increased, thereby elongating the read time.

Furthermore, the circuit of FIG. 14 has the following problem: When the RAM has a large scale, the loads of the bit lines 1432 and 1433 (the load capacitance of the bit lines, the wire resistances, and the drain capacities of the memory cells) are increased as described above. When a pair of such bit lines is selected to be connected to a data line for a data read operation, the latch type sense circuit 1407 discharges both the load capacitance of the data line and the increased load capacities of the bit lines. As a result, the circuit is disadvantageous not only in long read time but also large current consumption required for amplifying the potential of one of the bit lines up to the supply voltage VDD by the sense circuit 1407.

SUMMARY OF THE INVENTION

The object of the invention is providing a read circuit which can detect potential variation of a bit line in a short period of time and can read a data at a high speed even when the bit line has a large load capacitance.

In order to achieve the object, according to the present invention, when a data is read out, i.e., when charge of a bit line and a data line is discharged through a current mirror circuit and a latch type sense circuit, a transistor is disposed on the discharge path, thereby substantially separating part of the discharge path. Thus, a small capacitance alone is discharged, resulting in a high discharge rate and fast data reading. In the present invention, by operating the interposed transistor in a saturation region, the impedance between points before and after the transistor becomes substantially infinity, thereby making the points substantially open-circuited.

Specifically, the data read circuit of the invention is used in a semiconductor storage device including a dynamic circuit having a first data line which is precharged to a predetermined potential in a precharge period and connected to a plurality of memory cells. The data read circuit comprises a second data line which is precharged to a predetermined potential in the precharge period; current supply means connected to the first data line for detecting potential variation of the first data line so as to supply a current in response to detection of the potential variation; a current mirror circuit including a current input terminal for receiving the current from the current supply means and a current output terminal connected to the second data line, for receiving the current from the current supply means as a reference current and allowing a current to flow from the current output terminal to the ground so as to discharge the second data line; a control transistor for connecting the first data line to the second data line; and open control means for setting a potential of a control electrode of the control transistor at an intermediate potential which allows the control transistor to be operated in a saturation region during an operation of the current mirror circuit to allow the current to flow, so that the first data line and the second data line are substantially open-circuited.

Alternatively, the data read circuit of the invention is used in a semiconductor storage device being provided with a bit line pair including two bit lines to which a memory cell is connected; a data line pair including two data lines and connected to the bit line pair; and a latch type sense circuit connected to the data line pair for reading a data stored in the memory cell from the bit line pair to the data line pair, in which a data is written in the memory cell from the data line pair via the bit line pair in a data write operation. The data read circuit comprises two control transistors interposed between the bit line pair and the data line pair; and potential control means connected to control electrodes of the respective control transistors for controlling potentials of the control electrodes. In a data read operation where the latch type sense circuit is operated, the potential control means sets the potentials of the control electrodes of the control transistors at an intermediate potential that is smaller than a supply voltage but exceeds a ground voltage so as to operate the control transistors in a saturation region, and in the data write operation, the potential control means sets the potentials of the control electrodes of the control transistors at potentials which allow the control transistors to be operated in a linear region.

Owing to the configuration of the invention, the transistor is operated in the saturation region in reading a data from the memory cell, the impedance between the first data line and the second data line becomes substantially infinity and the data lines are substantially open-circuited. As a result, the current mirror circuit discharges only the second data line having a small capacitance. Therefore, even when the first data line has a large load capacitance resulting from a large number of memory cells connected thereto, the discharge of the second data line, i.e., the data read operation, can be conducted at a high rate.

Also according to the invention, when a data in the memory cell is read from the bit line pair to the data line pair by means of the latch type sense circuit, the transistors are operated in the saturation region under control of the control means. Thus, the impedance between the bit line and the data line becomes substantially infinity and these lines are substantially open-circuited. As a result, the latch type sense circuit discharges only the data line. Therefore, even when the bit line has a large load capacitance resulting from a large number of memory cells connected thereto, the discharge of the data line can be conducted in a short period of time, resulting in a quick data read operation. When a data is written in the memory cell from the data line via the bit line, the transistors are operated in a linear region. Therefore, the data is transferred to the memory cell at a low impedance, resulting in a quick write operation.

The above and other objects and novel features of the invention will more fully appear from the following detailed description when the same is read in connection with the accompanying drawings.

BRIEF DESCRIPTION OF THE DRAWINGS

The accompanying drawings show preferred embodiments of the invention, wherein:

FIG. 4(a) is a diagram showing a main part configuration of a read circuit for a register file according to a second embodiment of the invention and FIG. 4(b) is a diagram showing another main part configuration of the read circuit according to the second embodiment;

DETAILED DESCRIPTION OF THE INVENTION

The present invention will now be described by means of preferred embodiments referring to the accompanying drawings.

Figure 1:
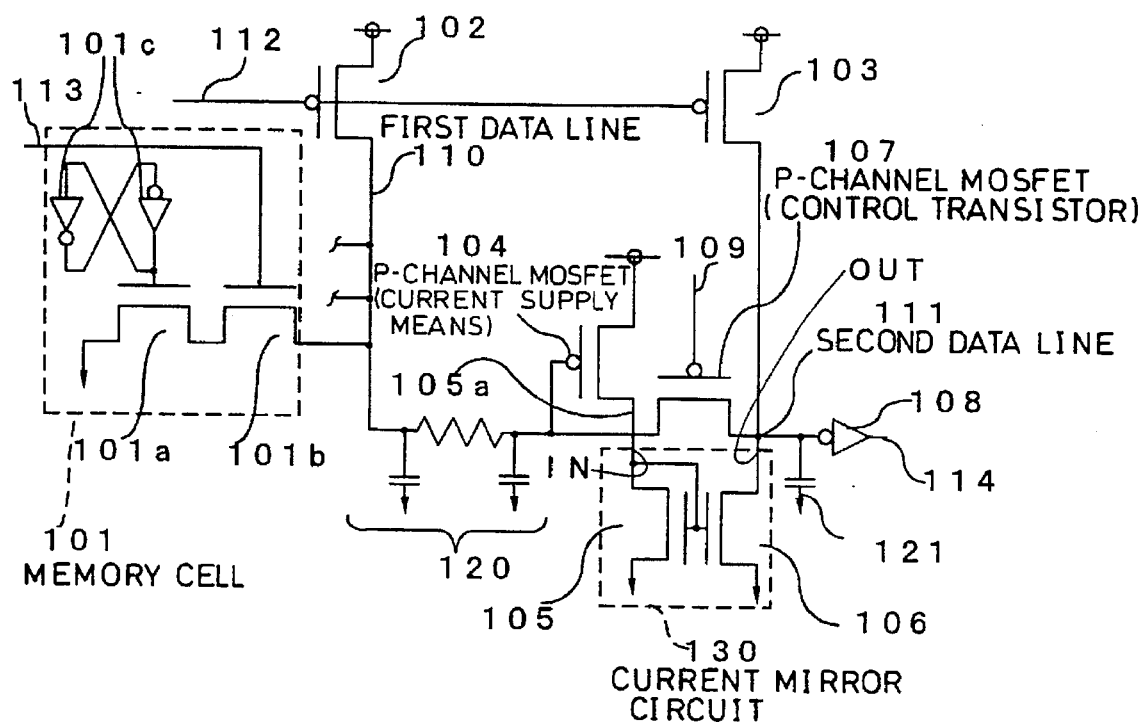
FIG. 1 is a diagram showing the main part configuration of a read circuit for a register file according to a first embodiment of the invention.

Embodiment 1:

FIG. 1 is a circuit diagram showing the main part configuration of a read circuit for a register file according to a first embodiment.

In the circuit of FIG. 1, a memory cell 101 included in a register file comprises N-channel MOSFETs 101a and 101b and latch circuits 101c. A first data line (bit line) 110 is connected to a plurality of memory cells 101 (merely one of which is shown in FIG. 1) and a load 120 including a wire resistance, a wire capacitance and the like and is precharged by a precharge circuit 102 constituted with a P-channel MOSFET. A second data line 111 is precharged by a precharge circuit 103 constituted with a P-channel MOSFET. These two precharge circuits 102 and 103 precharge the first and second data lines 110 and 111, respectively, to a high level under control of a precharge enable line 112.

A P-channel MOSFET (current supply means) 104 is connected to the first data line 110 at its gate and to a power supply line at its source. When the potential Vb of the first data line 110 attains a value obtained by the following formula 1, the P-channel MOSFET 104 allows a current to flow from its drain, thereby detecting change in the potential of the first data line 110:

Formula 1:

$$VDD - Vtp \geq Vb$$

wherein VDD indicates a supply voltage and Vtp indicates a threshold voltage of the P-channel MOSFET 104.

A current mirror circuit 130 includes two N-channel MOSFETs 105 and 106, and also has a current input terminal IN and a current output terminal OUT. The current input terminal IN is connected to the drain of the P-channel MOSFET (current supply means) 104, and the current output terminal OUT is connected to the second data line 111. The N-channel MOSFET (first transistor) 105 is connected to the current input terminal IN at its drain, to the ground at its source and to the current input terminal IN at its gate (control electrode). The other N-channel MOSFET (second transistor) 106 is connected to the second data line 111 at its drain, to the ground at its source and to the current input terminal IN at its gate (control electrode).

A control transistor 107, which is a characteristic element of the invention, is constituted with a P-channel MOSFET. The P-channel MOSFET 107 is connected to the first data line 110 at its source and to the second data line 111 at its drain, and is supplied with an intermediate potential via an intermediate potential supply line 109 at its gate (control electrode). The intermediate potential is generated by an intermediate potential generation circuit (open control means) 300 shown in FIG. 3(a), and has a potential of approximately 2.0 V in this embodiment as described in detail below.

Next, the intermediate potential generation circuit 300 will be described. An exemplified configuration shown in FIG. 3(a) includes an P-channel MOSFET 301 for pull-up, an P-channel MOSFET 302 and 304 connected in series for pull-down and an inverter circuit 303 for logically inverting a potential set signal input through an input line 310. In the P-channel MOSFET 302, a gate and a drain are connected to each other. When the potential of the potential set signal 310 is at a high level, the potential of an output line 109 (corresponding to the intermediate potential supply line of FIG. 1) is at a high level by ON operation of the P-channel MOSFET 301. When the potential of the potential set signal 310 is at a low level, the potential of the intermediate potential supply line 109 attains a voltage (2·Vtp), i.e., a voltage higher than the ground voltage VSS by a threshold voltage Vtp of the P-channel MOSFETs 302, 304.

Figure 3A:
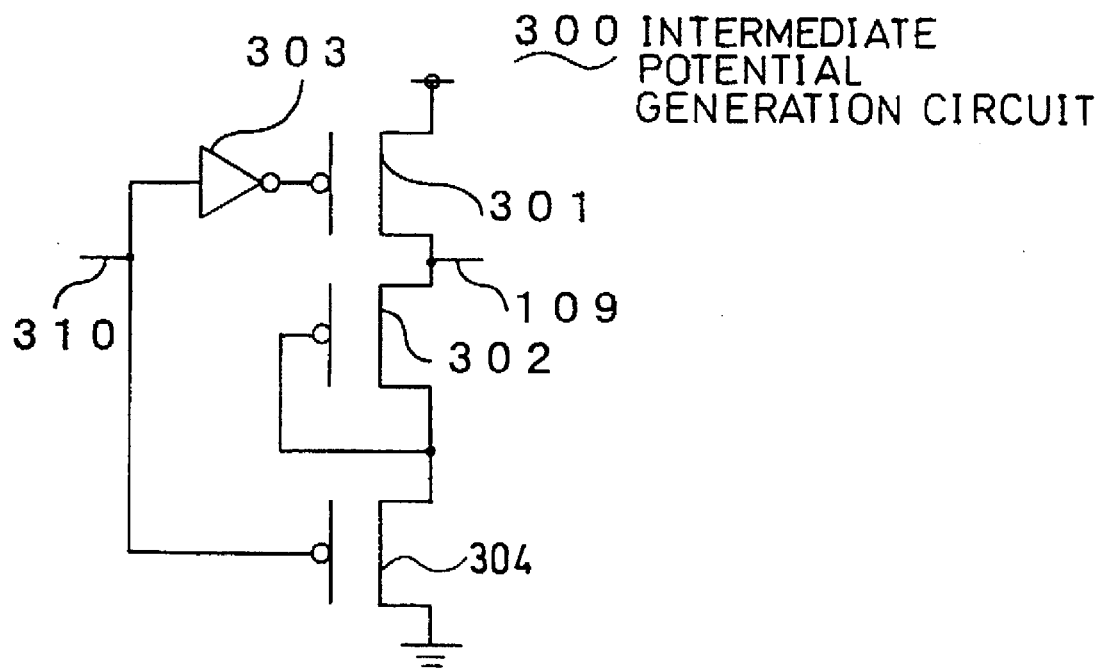
FIG. 3(a) is a diagram showing a configuration of an intermediate potential generation circuit in the read circuit of FIG. 1.

In the intermediate potential generation circuit 300 having the configuration of FIG. 3(a), when the supply voltage is assumed to be 3.3 V and the threshold voltage Vtp of the P-channel MOSFETs 302, 304 is assumed to be approximately 0.7 V, the intermediate potential to be supplied to the intermediate potential supply line 109 is 2.0 V because the threshold voltage Vtp is increased to be approximately 1.0 V owing to the body bias effect.

In the read circuit of this embodiment, an inverter circuit 108 is provided to drive an output load. The inverter circuit 108 is connected to the second data line 111 at its input port, so as to output a potential obtained by logically inverting the potential of the second data line 111 to a sense output line (output line) 114.

The operation of the read circuit of this embodiment will now be described referring to operation timing charts shown in FIGS. 2(a) and 2(b), wherein waveforms of the potentials corresponding to the respective signal lines of the read circuit of FIG. 1 are referred to by using the same reference numerals as those used in FIG. 1. For comparison, FIG. 2(a) also shows the timing chart of the conventional read circuit of FIG. 9 and FIG. 2(b) also shows the timing chart of the conventional sense circuit of FIG. 10. In both FIGS. 2(a) and 2(b), the operations of the conventional circuits are shown with broken lines.

Generally, the condition to turn on a MOSFET is expressed by the following formula 2 and the condition to operate a MOSFET in a saturation region is expressed by the following formula 3:

Formula 2:

$$Vgs \geq Vt$$

Formula 3:

$$Vds \geq Vgs - Vt$$

wherein Vgs indicates a potential between the gate and the source, Vds indicates a potential between the drain and the source and Vt indicates a threshold voltage of the MOSFET. Therefore, when the formula 2 is not satisfied, the MOSFET is in an off state, and when the formula 2 is satisfied but the formula 3 is not satisfied, the MOSFET is operated in a linear region. When both formulas 2 and 3 are satisfied, the MOSFET is operated in the saturation region, i.e., the MOSFET is operated as a current source, under which conditions a current can flow into or out of the MOSFET but the impedance thereof is substantially infinity.

The operation of the read circuit will now be described on the basis of these operation conditions. It is assumed that the memory cell 101 stores a data of a logic value of "1", and the potentials of the intermediate potential supply line 109, the first data line 110 and the second data line 111 are indicated as Vgp, Vb and Vd, respectively, and the threshold voltage of the P-channel MOSFET 107 is indicated as Vtp. Since the potentials Vb and Vd of the first and second data lines 110 and 111 are varied in connection with the data read operation, the time periods in which one or both of the formulas 2 and 3 are satisfied are also varied in accordance with the potential variation.

The read circuit is operated as follows in a data read operation where one memory cell 101 storing a data at a high level is discharged. Before reading the data, both the potentials Vb and Vd of the first and second data lines 110 and 111 are precharged to be equal to the supply voltage VDD. At the initial stage of the read operation, the memory cell 101 starts to be discharged owing to the low to high transition of the word line 113, thereby lowering the potential Vb of the first data line 110. At this point, the voltage Vgs between the gate and the source and the voltage Vds between the source and the drain of the P-channel MOSFET 107 are expressed by the following formulas 4 and 5, respectively:

Formula 4:

$$Vgs = Vd - Vgp$$

Formula 5:

$$Vds = Vd - Vb$$

The substitution of the formulas 2 and 3 in the formulas 4 and 5 and simplification of the resultant formulas provide the following formulas 6 and 7 as the conditions to turn on the P-channel MOSFET 107 and to operate it in the saturation region, respectively:

Formula 6:

$$Vgp \leq Vd - Vtp$$

Formula 7:

$$Vgp \geq Vb - Vtp$$

Now, the description will be made by using specific examples of the numeric values. It is assumed that the supply voltage VDD is 3.3 V, and that the threshold voltage Vtp of the P-channel MOSFET 107 is 1.0 V in consideration of body bias effect. Then, the gate voltage Vgp of the P-channel MOSFET 107 is equal to a voltage generated by the intermediate potential generation circuit 300, i.e., 2.0 V. Therefore, at the initial stage of the read operation, the formula 6 for the on condition is satisfied but the formula 7 for the operation in the saturation region is not satisfied, the P-channel MOSFET 107 is operated in the linear region.

Then, when the potential Vb of the first data line 110 is decreased to 3.0 V, the formula 7 for the operation in the saturation region is satisfied, the P-channel MOSFET 107 starts to be operated in the saturation region. Therefore, the impedance between the first data line 110 and the second data line 111 becomes substantially infinity.

After that, when the potential Vb of the first data line 110 is decreased to 2.6 V (i.e., VDD−Vtp=3.3−0.7), the P-channel MOSFET 104 is turned on, thereby allowing a drain current to flow. Since the drain current of the P-channel MOSFET 104 is input to the current mirror circuit 130 as a reference current, the reference current induces an output current of the current mirror circuit 130 flowing to the drain of the N-channel MOSFET 106. Since the drain of the N-channel MOSFET 106 works as the output terminal OUT of the current mirror circuit 130 and is connected to the second data line 111, the charge of the second data line 111 is discharged by the output current of the current mirror circuit 130. At this point, the P-channel MOSFET 107 is operated in the saturation region because the formulas 6 and 7 are both satisfied as described above. Therefore, the impedance between the first data line 110 and the second data line 111 becomes substantially infinity at this point, the two data lines are substantially open-circuited. A load capacitance 121 of the second data line 111 is a sum of the drain capacities of the P-channel MOSFET 103 and the N-channel MOSFET 106 and the input capacitance of the inverter circuit 108, and has a small value. Therefore, even when a load capacitance 120 of the first data line 110, that is, a sum of the wire resistance, the wire capacitance of the first data line 110 and the drain capacities of the plural memory cells 101 connected to the first data line 110, is large, the N-channel MOSFET 106 of the current mirror circuit 130 suffices to discharge the small load capacitance 121. Accordingly, the data read operation can be conducted at a high speed.

As the second data line 111 is discharged by the current mirror circuit 130, the potential Vd of the second data line 111 is decreased to be lower than the potential Vb of the first data line 110. At this point, the voltage Vgs between the gate and the source and the voltage Vds between the source and the drain of the P-channel MOSFET 107 are expressed by the following formulas 8 and 9, respectively:

Formula 8:

$$Vgs = Vb - Vgp$$

Formula 9:

$$Vds = Vb - Vd$$

The substitution of the formulas 8 and 9 in the formulas 2 and 8 and the simplification of the resultant formulas provide the following formulas 10 and 11 as the conditions to turn on the P-channel MOSFET 107 and to operate it in the saturation region, respectively:

Formula 10:

$$Vgp \leqq Vb - Vtp$$

Formula 11:

$$Vgp \geqq Vd - Vtp$$

At this point, since the potential Vb of the first data line 110 is lower than 2.6 V (i.e., VDD−Vtp), the formula 10 is not satisfied, the P-channel MOSFET 107 is in an off state. Therefore, the second data line 111 is separated from the first data line 110 and is discharged through the discharging N-channel MOSFET 106 of the current mirror circuit 130.

Figure 2A:
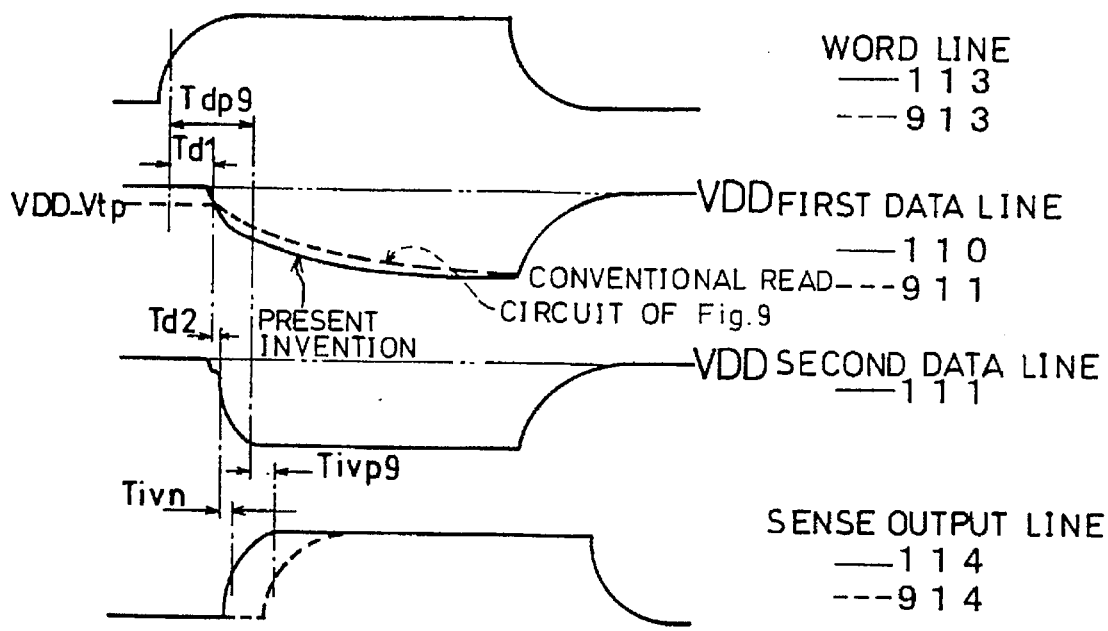
FIGS. 2(a) and 2(b) are timing charts of the operation of the read circuit of FIG. 1 in comparison with those of conventional circuits.

The read time Tsn of the read circuit of this embodiment is obtained as a sum of time Td1, time Td2 and time Tivn as is shown in FIG. 2(a), wherein the time Td1 indicates time required for the potential Vb of the first data line 110 to be decreased to a voltage lower than the supply voltage VDD by the threshold voltage Vtp of the P-channel MOSFET 104, i.e., VDD−Vtp, after the low to high transition of the word line 113; the time Td2 indicates time required for the potential Vd of the second data line 111 to exceed the logic threshold voltage of the inverter circuit 108 after the potential Vb of the first data line 110 exceeds the threshold voltage of the P-channel MOSFET 104; and the time Tiny indicates delay time of the inverter circuit 108. The potential of the sense output line 114 is defined after the delay time Tinv has elapsed.

Accordingly, in most part of the data read operation, the impedance between the second data line 111 and the first data line 110 is substantially infinity, so as to minimize the load capacitance to be driven by the discharging N-channel MOSFET 106, resulting in a short read time.

As described so far, the read circuit of this embodiment can achieve a short read time for the following reason: At the initial stage of the data read operation, a potential difference is caused by current flow from the memory cell 101. Then, the subsequent main read operation is conducted while the P-channel MOSFET 107 is operated in the saturation region or in an off state, so that the first data line 110 and the second data line 111 are substantially open-circuited.

Figure 9:
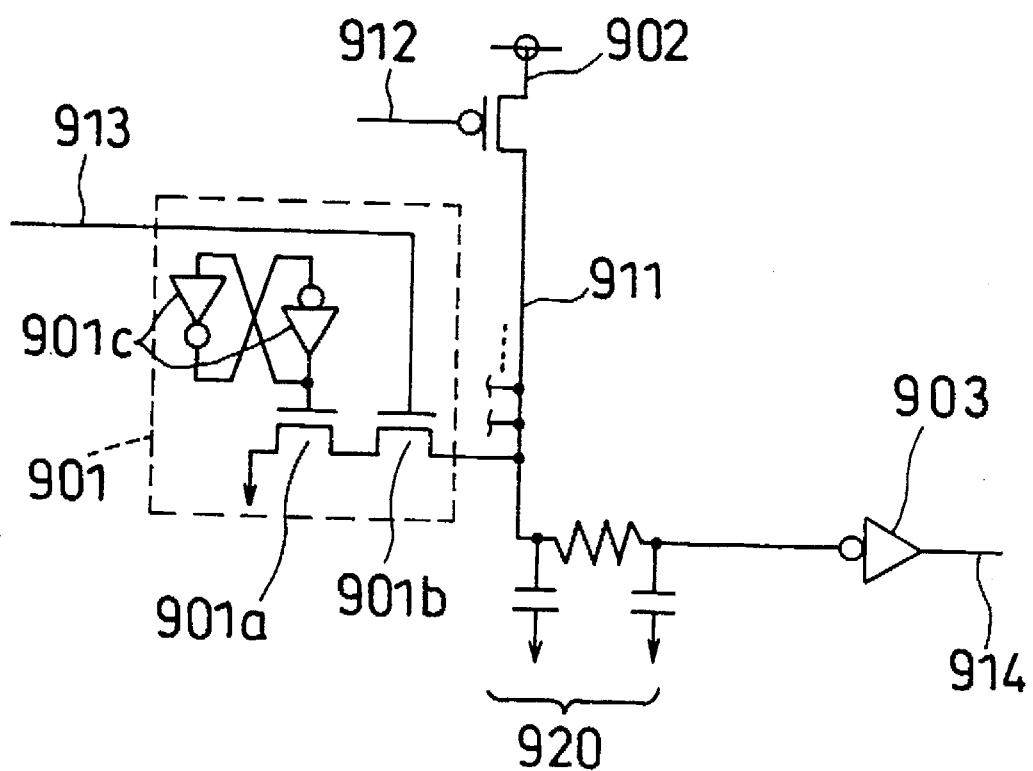
FIG. 9 is a diagram showing the configuration of a conventional read circuit for a register file.

In contrast, in the conventional read circuit of FIG. 9, the data line 911 1s discharged merely through the N-channel MOSFETs 901a and 901b of the memory cell 901 as is shown in FIG. 2(a), resulting in delaying the discharge time as shown with a broken line. After delay time Tdp9 (>Td1+Td2) has elapsed, the potential of the data line 911 is varied to be equal to the logic threshold voltage of the inverter circuit 903. Furthermore, after delay time Tivp9 of the inverter circuit 903 has elapsed, the potential of the sense output line 914 is defined. Since the slew rate of the input waveform of the inverter circuit 903 is small (i.e., the curve is gentle), the delay time Tivp9 is longer than the delay time Tivn of the inverter circuit 108 even when the inverter circuit 903 is identical to the inverter circuit 108 of FIG. 1. Therefore, the read time Tsp9 of the read circuit of FIG. 9 is obtained as a sum of the time Tdp9 and the delay time Tivp9, which is longer than the read time Tsn of the present read circuit.

Figure 2B:
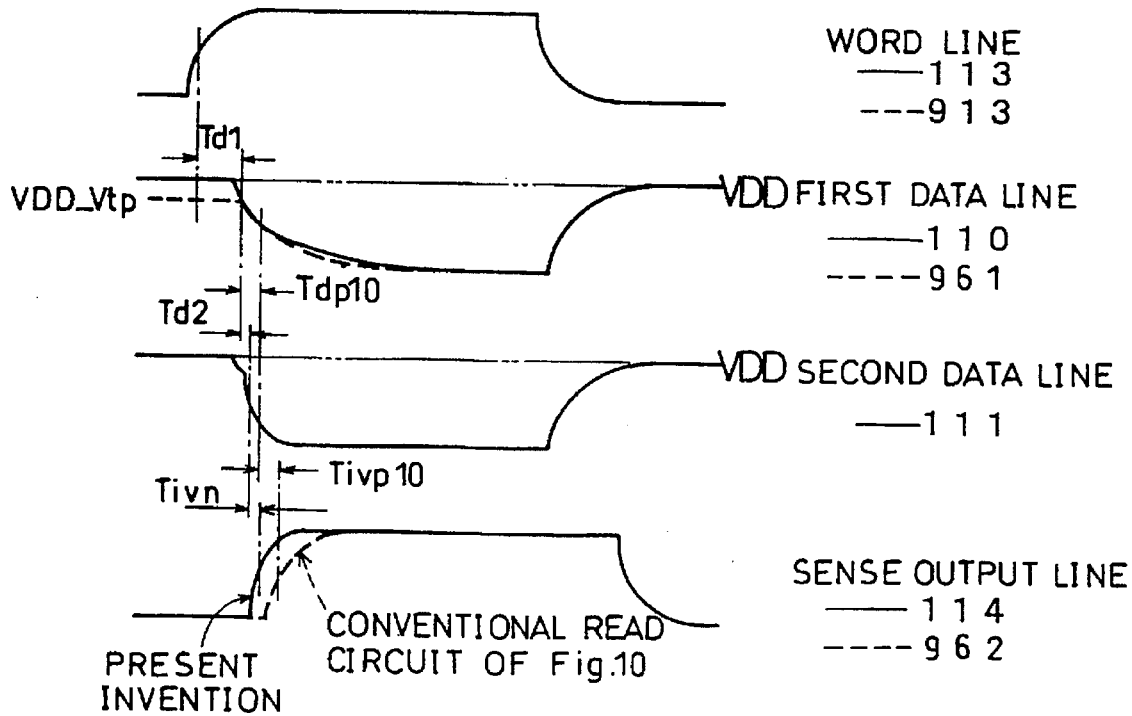
Figure 10:
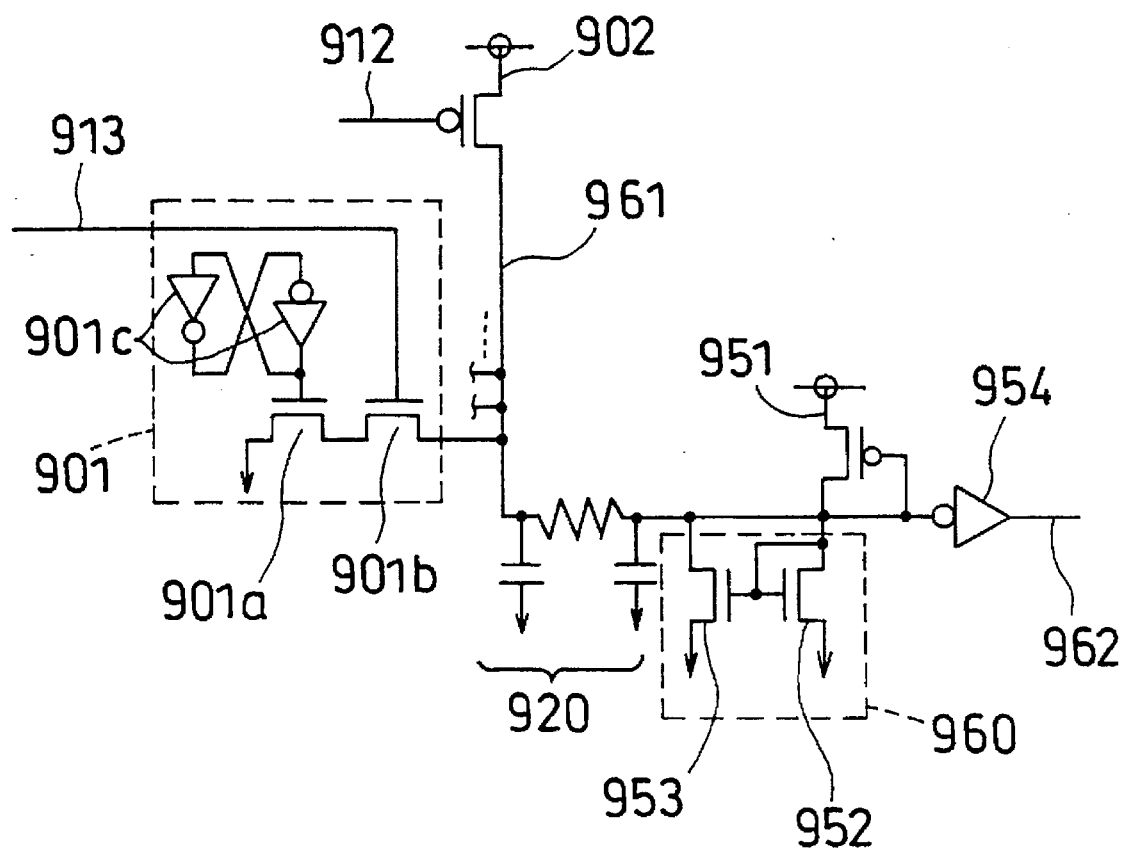
FIG. 10 is a diagram showing the configuration of another conventional read circuit for a register file.

In the other conventional read circuit of FIG. 10, time required for the potential of the data line 961 to be decreased to a voltage lower than the supply voltage VDD by the threshold voltage Vtp, i.e., VDD−Vtp, is equal to the time Td1 of the read circuit of FIG. 1 as is shown in FIG. 2(b). Then, the data line 961 is discharged through the N-channel MOSFETs 901a and 901b of the memory cell 901 as well as the N-channel MOSFET 953 of the current mirror circuit 960. When the load of the data line is large, however, the discharge time becomes longer as is shown with a broken line because the discharge current of the N-channel MOSFET 953 is limited. After delay time Tdp10 (>Td2) has elapsed, the potential of the data line 961 is varied to be equal to the logic threshold voltage of the inverter circuit 954. Then, after delay time Tivp10 of the inverter circuit 954 has elapsed, the potential of the sense output line 962 is defined. Since the slew rate of the input waveform of the inverter circuit 954 is small, the delay time Tivp10 is longer than the delay time Tivn of the inverter circuit 108 even when the inverter circuit 954 is identical to the inverter circuit 108 of FIG. 1. Therefore, read time Tsp10 of the read circuit of FIG. 10 is obtained as a sum of the time Td1, the time Tdp10 and the delay time Tivp10, which is longer than the read time Tsn of the present read circuit.

Figure 3B:
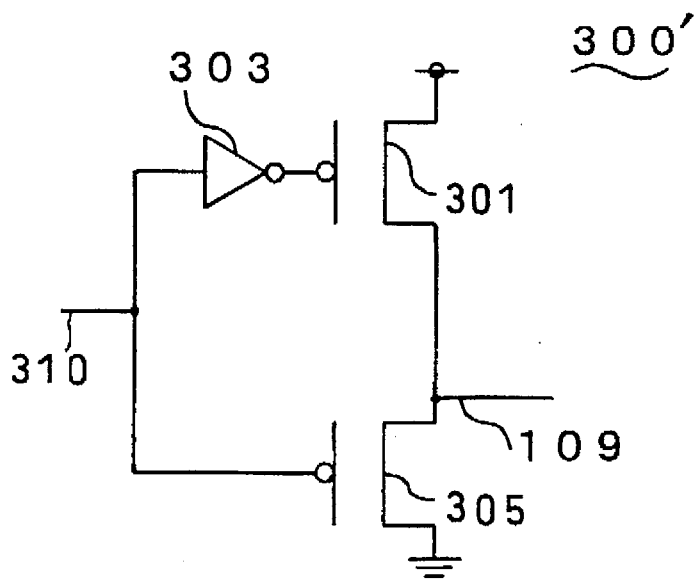
FIG. 3(b) is a diagram showing another configuration of the intermediate potential generation circuit.

FIG. 3(b) shows the configuration of an intermediate potential generation circuit 300' used when the potential of the intermediate potential supply line 109 is decreased down to an intermediate potential Vtp.

The intermediate potential generation circuit 300' of FIG. 3(b) comprises P-channel MOSFET 305 for pull-down. The potential of the intermediate potential supply line 109 is at a high level when the potential of the potential set signal 310 is at a high level. When the potential of the potential set signal 310 is at a low level, the potential of the intermediate potential supply line 109 is a potential Vtp, which is higher than the ground voltage VSS by the threshold voltage Vtp of the P-channel MOSFET 306. In the case where the first data line 110 and the second data line 111 are precharged up to a voltage (VDD−Vtn) by the N-channel MOSFET, usage of the circuit of FIG. 3(b) satisfies the formulas 2 and 3, and hence, the P-channel MOSFET 107 can be operated in the saturation region.

In the case where the read circuit is used for a ROM or the like, when the cell width of the read circuit is large as compared with the width of a bit line (corresponding to the first data line), a MOSFET for selecting a bit line can be provided for area conformity. The P-channel MOSFET 107 of this embodiment can be used as the MOSFET for selecting a bit line. Specific description of this application will be shown as Embodiment 5 described below.

Although the current mirror circuit of this embodiment is constituted with N-channel MOSFETs, P-channel MOSFETs can realize a similar circuit.

Embodiment 2:

FIGS. 4(a) and 4(b) show the main part configuration of read circuits for a register file according to a second embodiment of the invention. In FIGS. 4(a) and 4(b), like reference numerals are used to refer to like elements shown in FIG. 1.

The read circuits of FIGS. 4(a) and 4(b) comprise P-channel MOSFETs 401 and 402, respectively, for suppressing, to be small or to zero, a current amount supplied by a P-channel MOSFET 104 in accordance with the potential of a sense output line 114.

In the read circuit of FIG. 4(a), the P-channel MOSFET (supply current amount control means) 401 is connected to the drain of the P-channel MOSFET (current supply means) 104 at its source, to the current input terminal IN of a current mirror circuit 130 at its drain, and to the sense output line 114 of an inverter circuit 108 at its gate.

Accordingly, in this read circuit, when a second data line 111 is precharged and the potential of the sense output line 114 is at a low level, the P-channel MOSFET 401 is in an on state. In the subsequent read operation, as the potential of a first data line 110 is decreased, a reference current flows from the P-channel MOSFET 104 to the current mirror circuit 130, thereby allowing the current mirror circuit 130 to discharge the second data line 111. The potential of the second data line 111 is decreased as a result of the discharge, and the potential of the sense output line 114 of the inverter circuit 108 is defined as a high level. Then, the P-channel MOSFET 401 is turned off, resulting in cutting off a DC current path present between the P-channel MOSFET 104 and the current mirror circuit 130. Thus, no DC current flows through this read circuit.

In the read circuit of FIG. 4(b), the P-channel MOSFET (supply current amount control means) 402 is connected to a node between the sources of N-channel MOSFETs 105 and 106 of a current mirror circuit 130 at its source, to the ground at its drain, and to a sense output line 114 of an inverter circuit 108 at its gate. Therefore, in this read circuit, similarly to the read circuit of FIG. 4(a), a wasteful DC current is prevented from flowing when the potential of the sense output line 114 is defined as a high level. Accordingly, not only a short read time but also low power consumption can be realized.

Figure 5A:
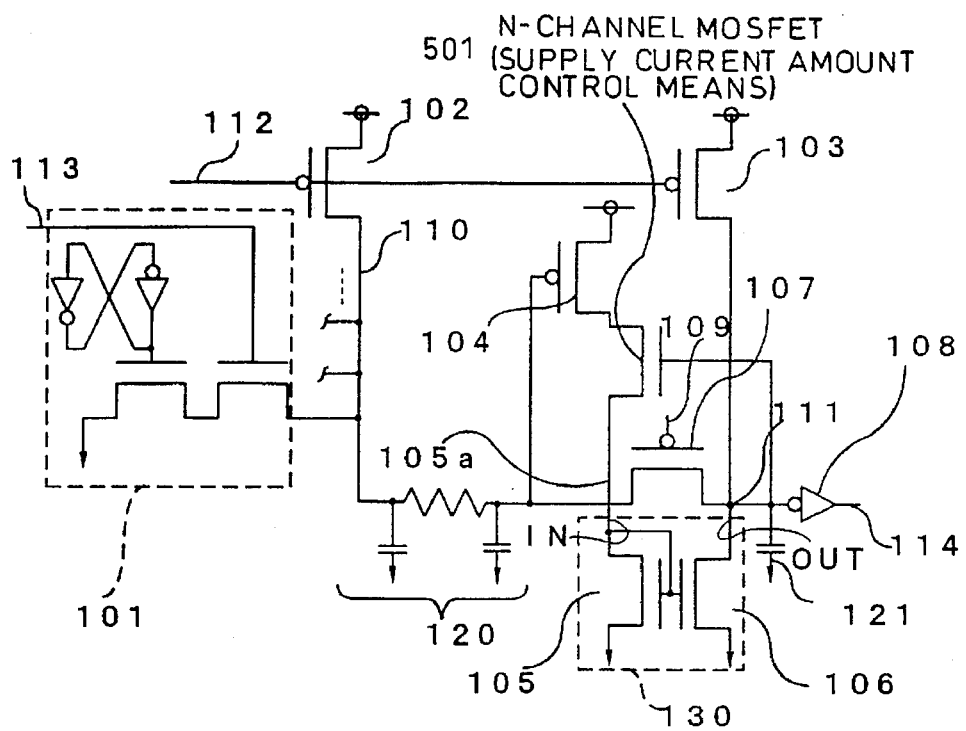
FIG. 5(a) is a diagram showing a main part configuration of a read circuit for a register file according to a third embodiment of the invention and FIG. 5(b) is a diagram showing another main part configuration of the read circuit according to the third embodiment.
Figure 5B:
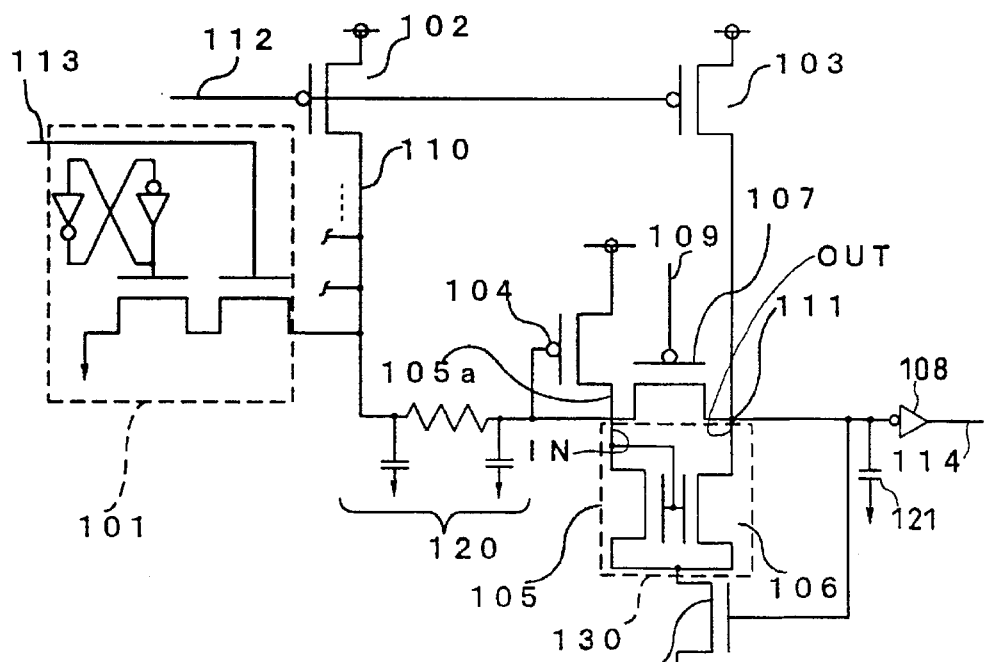

Embodiment 3:

FIGS. 5(a) and 5(b) show the main part configuration of read circuits for a register file according to a third embodiment of the invention. In FIGS. 5(a) and 5(b), like reference numerals are used to refer to like elements shown in FIG. 1.

The read circuits of FIGS. 5(a) and 5(b) comprise N-channel MOSFETs 501 and 502, respectively, for suppressing, to be small or to zero, a current amount supplied by a P-channel MOSFET 104 in accordance with the potential of a second data line 111.

In the read circuit of FIG. 5(a), the N-channel MOSFET (supply current amount control means) 501 is connected to the drain of the P-channel MOSFET (current supply means) 104 at its drain, to the current input terminal IN of a current mirror circuit 130 at its source, and to a second data line 111 at its gate.

Accordingly, in the read circuit of FIG. 5(a), when the second data line 111 is precharged to be at a high level, the N-channel MOSFET 501 is in an on state. Therefore, in the subsequent read operation, a reference current flows from the P-channel MOSFET (current supply means) 104 to the current mirror circuit 130, thereby discharging the potential of the second data line 111. When the potential of the second data line 111 is defined as a low level, the N-channel MOSFET (supply current amount control means) 501 is turned off. As a result, a DC current path to the current mirror circuit 130 is cut off to prevent a DC current from flowing. Thus, this read circuit can realize low power consumption.

In the read circuit of FIG. 5(b), the N-channel MOSFET (supply current amount control means) 502 is connected to the sources of N-channel MOSFETs 105 and 106 of a current mirror circuit 130 at its drain, to the ground at its source, and to a second data line 111 at its gate. Therefore, also in the read circuit of FIG. 5(b), a wasteful DC current is prevented from flowing when the potential of the second data line 111 is defined as a low level. Thus, not only a short read time but also low power consumption can be realized.

Figure 6:
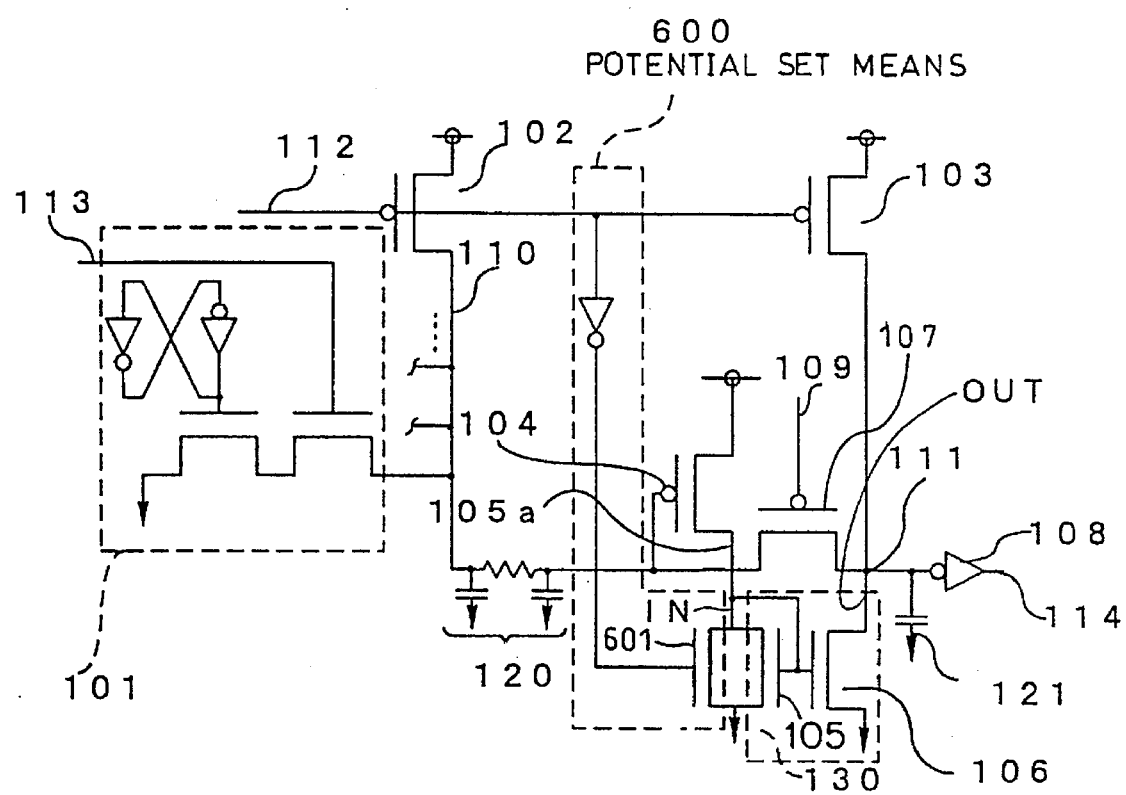
FIG. 6 is a diagram showing the main part configuration of a read circuit for a register file according to a fourth embodiment of the invention.

Embodiment 4:

FIG. 6 shows the main part configuration of a read circuit for a register file according to a fourth embodiment of the invention. In FIG. 6, like reference numerals are used to refer to like elements shown in FIG. 1.

The read circuit of FIG. 6 comprises potential set means (separation means) 600 including an N-channel MOSFET 601 and an inverter circuit 602. The inverter circuit 602 logically inverts a precharge signal to be input to a precharge signal line 112. The N-channel MOSFET 601 is interposed between the current input terminal IN of a current mirror circuit 130 and the ground line, so as to receive a logically inverted signal from the inverter circuit 602 at its gate. In receiving the signal, i.e., while a second data line 111 is precharged, the N-channel MOSFET 601 is in an on state, thereby forcibly setting the potential of the current input terminal IN of the current mirror circuit 130 to be equal to a ground voltage.

The read circuit of this embodiment provides solution to the following disadvantage: The potential of the current input terminal IN of the current mirror circuit 130 is obtained as a potential divided by the resistance components of a P-channel MOSFET 104 and an N-channel MOSFET 105. Therefore, when the gate width of the N-channel MOSFET 105 is set to be small, the potential of the gate of the N-channel MOSFET 106 becomes high. When the gate width of the N-channel MOSFET 106 is set to be large, read time can be shortened because a large output current, i.e., a large drain current of the N-channel MOSFET 106, can be obtained. However, even when the discharge of the second data line 111 is completed, the potential of the gate of the N-channel MOSFET 106 remains to exceed the threshold voltage, the N-channel MOSFET 106 remains to be on. As a result, when the gate width of the N-channel MOSFET 105 is set to be too small, the N-channel MOSFET 106, which continues to be on, makes the potential of the second data line 111 fixed to a low level in precharging the second data line 111 next time. In addition, a DC current path is formed between a precharge circuit 103 and the N-channel MOSFET 106. This can result in a problem that longer time is required to precharge the potential of the second data line 111 to a high level or the second data line 111 cannot be precharged to a high level.

In the present read circuit, however, when the second data line 111 is precharged by turning on the precharge circuit (P-channel MOSFET) 103, the N-channel MOSFET 601 is in an on state. Therefore, the potential of the current input terminal IN of the current mirror circuit 130, i.e., the potential of the gates of the N-channel MOSFETs 105 and 106, is decreased down to the ground voltage. This turns off the N-channel MOSFET 106, thereby separating the current output terminal OUT of the current mirror circuit 130 from the second data line 111. In this manner, while the read time is shortened by setting small the gate width of the N-channel MOSFET 105, the potential of the second data line 111 can be stabilized and the precharge time can be shortened in the precharge of the second data line 111 conducted after the read operation.

It goes without saying that the potential set means 600 of this embodiment can be applied to any of the read circuits of FIGS. 4(a), 4(b), 5(a) and 5(b), and that the application provides the same effect.

Figure 7:
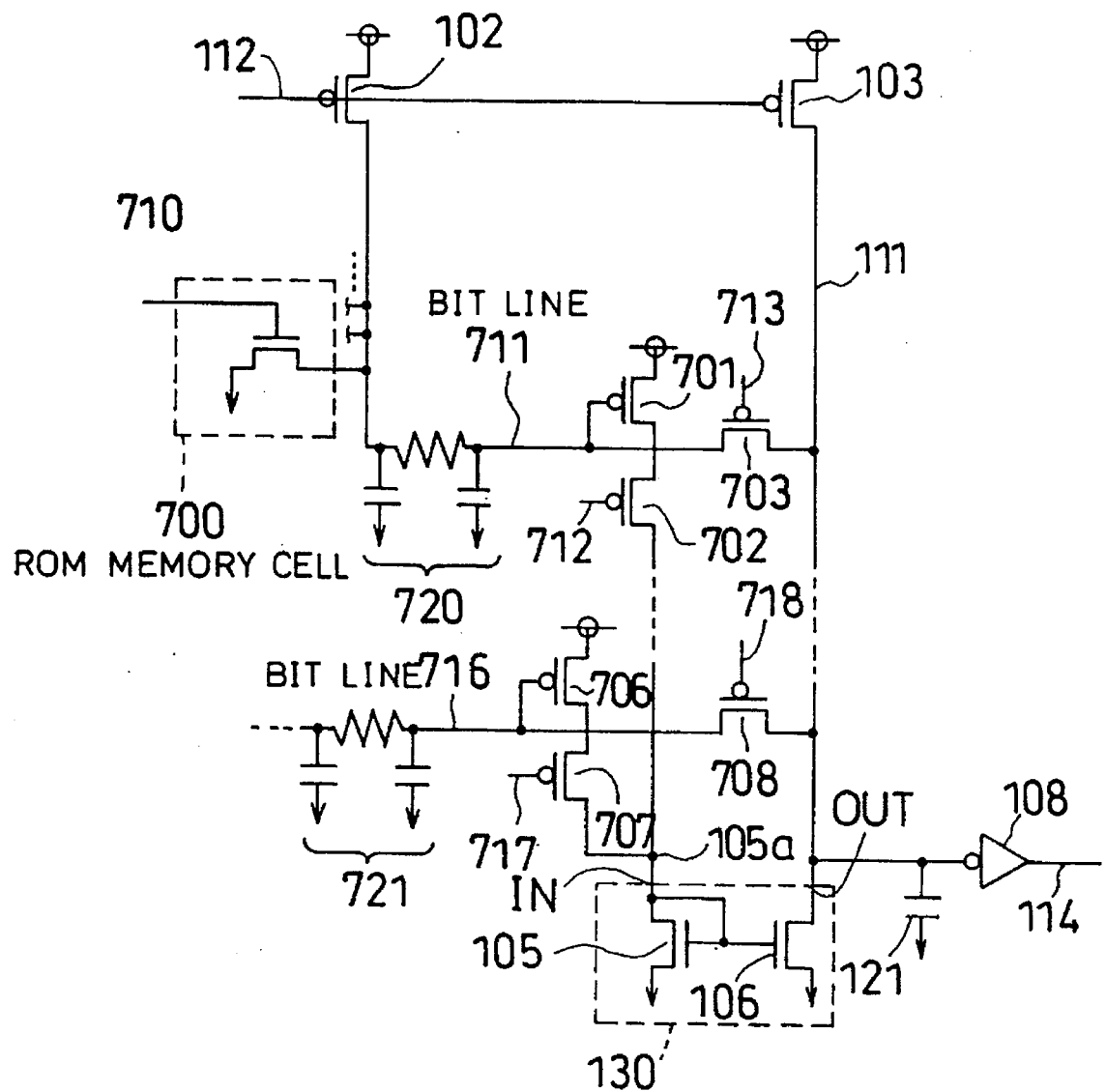
FIG. 7 is a diagram showing the main part configuration of a read circuit for a ROM according to a fifth embodiment of the invention.

Embodiment 5:

FIG. 7 shows the main part configuration of a read circuit for a ROM according to a fifth embodiment of the invention. In FIG. 7, like reference numerals are used to refer to like elements shown in FIG. 1, and the description is omitted.

In the application of a read circuit to a ROM or the like, since the width of the read circuit is large as compared with the width of a memory cell, a selector circuit is provided. The selector circuit selects one of a plurality of bit lines, and a signal is read through the selected bit line. This embodiment shows the application of the invention to such a read circuit including a selector circuit.

The circuit of FIG. 7 includes bit lines 711 and 716 and a memory cell 700 of a ROM. It is noted that the memory cell connected to the bit line 711 alone is shown in FIG. 7. The memory cell 700 is connected to a word line 710. When the potential of the word line 710 rises, the potential of the corresponding bit line 711 or 716 is decreased to a low level via the memory cell 700 connected to the word line 710. Each of the bit lines 711 and 716 has a load 720 or 721 including a wire resistance, a wire capacitance, a drain capacitance of the memory cell and the like. One of the bit lines of 711 and 716 is selected by a P-channel MOSFET 703 or 706. Therefore, both of the bit lines 711 and 716 act as a first data line 110 in FIG. 1.

The bit lines 711 and 716 are connected to a second data line 111 via P-channel MOSFETs 703 and 708 serving as selector circuits, respectively. The P-channel MOSFETs 703 and 708 are respectively connected, at their gates, to column address selection lines 713 and 718, whose potentials are set at an intermediate potential described below. The P-channel MOSFETs 703 and 708 serves as open control means according to the invention, which makes the impedance between the corresponding bit line 711 or 716 and the second data line 111 substantially infinity so as to make them substantially open-circuited.

P-channel MOSFETs 701 and 706, which form current supply means according to the invention, are respectively connected to the corresponding bit lines 711 and 716 at their gates, and to a power supply line at their sources, thereby detecting potential variation of the corresponding bit lines so as to supply a current from their drains.

P-channel MOSFETs 702 and 707 are respectively connected to the drains of the P-channel MOSFETs 701 and 706 at their sources, to the current input terminal IN of a current mirror circuit 130 at their drains, and to other column address selection lines 712 and 717 at their gates.

Figure 8:
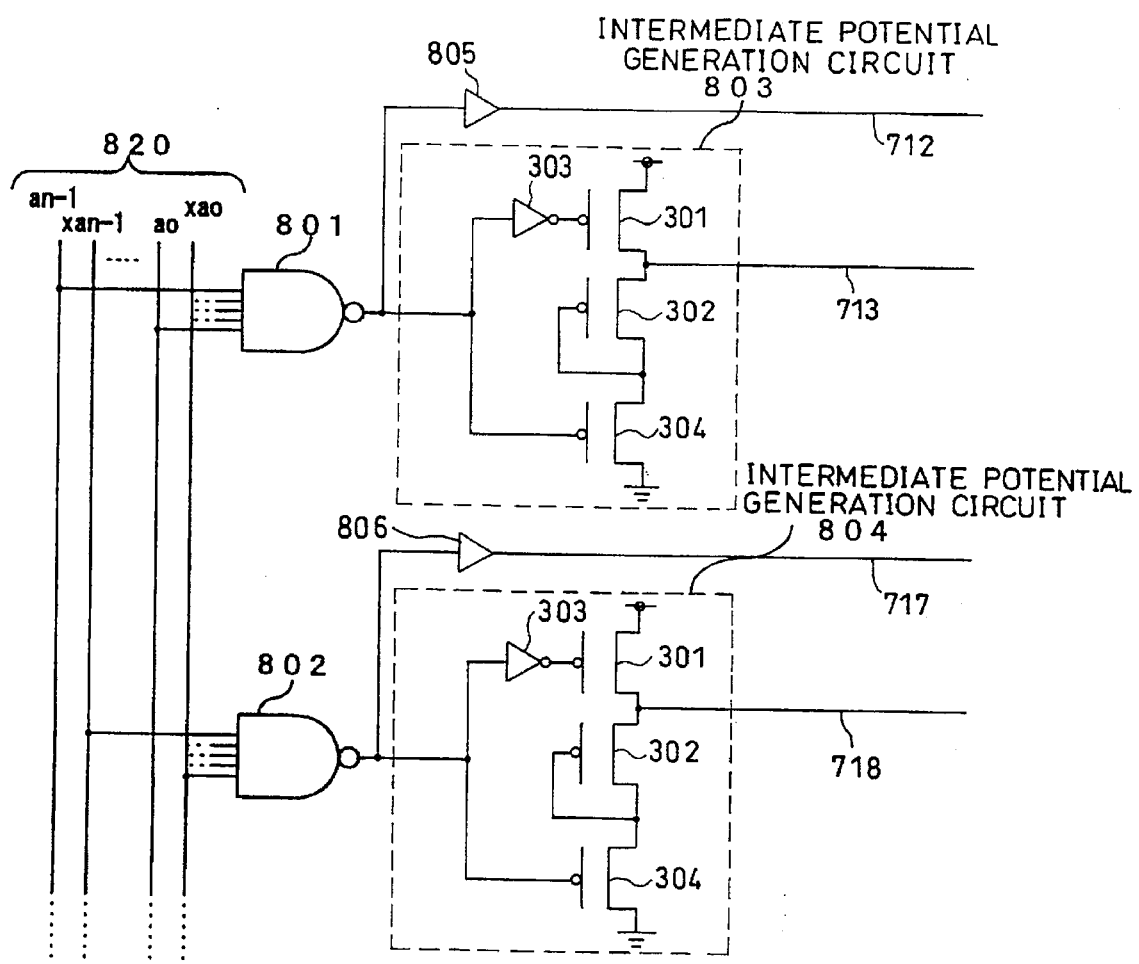
FIG. 8 is a diagram showing the main part configuration of a decoder circuit used in the read circuit of FIG. 7.

FIG. 8 shows an exemplified configuration of an intermediate potential generation circuit for generating the intermediate potential to be supplied to the column address selection lines 712, 718, 717 and 718. The circuit of FIG. 8 comprises input lines 820 for address signals $\{a_{n-1}, \ldots, a_0\}$ and logically inverted signals $\{xa_{n-1}, \ldots, xa_0\}$ of the address signals, a first decoder circuit 801 constituted with a multiinput NAND gate for receiving the address signals $\{a_{n-1}, \ldots, a_0\}$ from the input lines 820, a second decoder circuit 802 constituted with another multiinput NAND gate for receiving the logically inverted signals $\{xa_{n-1}, \ldots, xa_0\}$ of the address signals from the input lines 820, and first and second intermediate potential generation circuits 803 and 804 each having the same configuration as that of the intermediate potential generation circuit 300 shown in FIG. 3(a). The first intermediate potential generation circuit 803 receives the output of the first decoder circuit 801, generates an intermediate potential during the selection of the address, and outputs the intermediate potential to the column address selection line 713. The output potential of the first decoder circuit 801 is supplied to the column address selection line 712 via a buffer circuit 805. The second intermediate potential generation circuit 804 receives the output of the second decoder circuit 802, generates an intermediate potential during the selection of address, and outputs the intermediate potential to the column address selection line 718. The output potential of the second decoder circuit 802 is supplied to the column address selection line 717 via a buffer circuit 806.

The operation of the present read circuit for a ROM will now be described. For example, when the bit line 711 is selected, the potential of the column address selection line 712 is set at a low level, and the potential of the column address selection line 713 is set at an intermediate potential for allowing the P-channel MOSFET 703 to be operated in the saturation region. Simultaneously, the potential of the column address selection line 717 is set at a high level and the potential of the column address selection line 718 is also set at a high level in order to disable the selector circuit of the unselected bit line 716. Accordingly, as the potential of the selected bit line 711 is decreased, the P-channel MOSFET (current supply means) 701 supplies a current, which flows through the P-channel MOSFET 702 to the current input terminal IN of the current mirror circuit 130. As a result, the current mirror circuit 130 discharges the potential of the second data line 111. When the potential of the sense output line 114 is defined as a result of the discharge, the read operation is completed.

In the conventional selector circuit for selecting a column of a ROM, the ground voltage is applied to the gate of a MOSFET in the selector circuit so that the selector circuit is operated in the linear region. Therefore, the nodes at the both ends of the selector circuit are substantially connected to each other with a resistance. In contrast, in the present circuit, the P-channel MOSFETs (selector circuits) 703 and 708 are supplied with the intermediate potential at their gates, so as to be operated in the saturation region. Therefore, the selected bit line (first data line) 711 or 716 is separated from the second data line 111. As a result, the load capacitance of the current mirror circuit 130 on the basis of the N-channel MOSFET 106 is decreased by the capacitance of the selected bit line (first data line) 711 or 716. This results in short read time and a high read rate.

In addition, in this embodiment, the P-channel MOSFETs 703 and 708 serve as not only the selector circuits but also the open control means of the invention, and hence, the circuit scale can be made smaller than that of a circuit including a separate selector circuit. Thus, the circuit area can be minimized.

It goes without saying that the configuration as shown in any of FIGS. 4(a), 4(b), 5(a), 5(b) and 6 can be added to the configuration of the present read circuit in which one data line is selected among a plurality of data lines.

Figure 11:
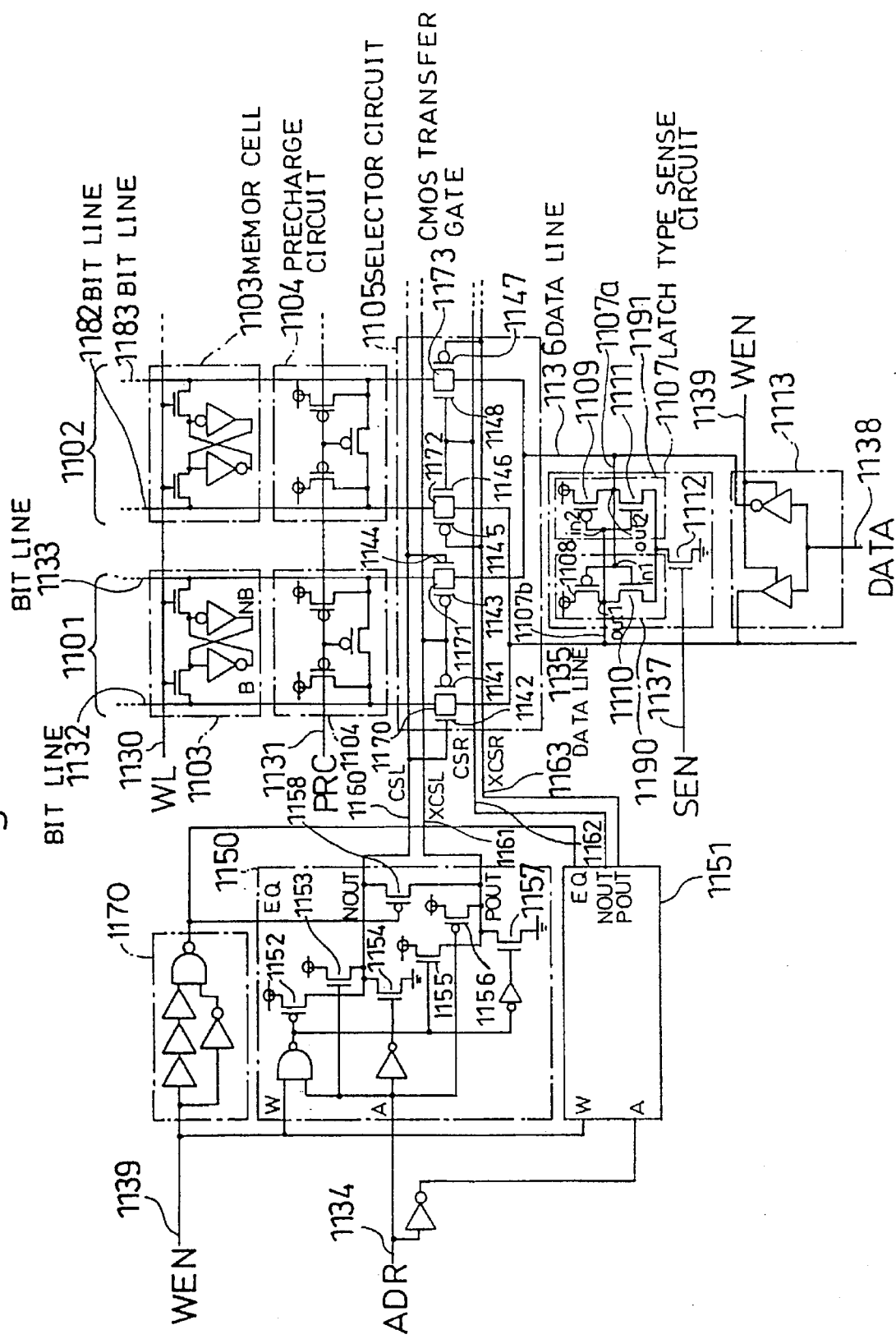
FIG. 11 is a diagram showing the main part configuration of a read circuit for a RAM according to a sixth embodiment of the invention.

Embodiment 6:

FIG. 11 shows the main part configuration of a read circuit for a RAM according to a sixth embodiment of the invention.

The circuit of FIG. 11 includes memory cell arrays 1101 and 1102, each of which covers one column of a RAM, bit lines 1132 and 1133 for the memory cell array 1101, and bit lines 1182 and 1183 for the memory cell array 1102. The memory cell arrays 1101 and 1102 have the same and one configuration, the following description will be made regarding merely one of the memory cell arrays. A memory cell 1103 is connected to a pair of bit lines, and a plurality of the memory cells 1103 (merely two of which are shown in FIG. 11) are connected to a word line WL 1130 in the column direction. A plurality of the memory cells 1103 are also connected to the pair of bit lines in the row direction, but are omitted in FIG. 11 for simplification. A data is read from or write in the memory cell 1103 via the bit line pair of the bit lines 1132 and 1133, or 1182 and 1183. A precharge circuit 1104 precharges/equalizes the potential of the bit lines to a predetermined potential in accordance with the potential of a precharge enable line PRC 1131.

A data line pair consisting of data lines 1135 and 1136 is connected to the bit line pair. The data line 1135 serves as a read line for one bit of a data.

A latch type sense circuit 1107 is connected to the data lines 1135 and 1136. The latch type sense circuit 1107 comprises a first inverter circuit 1190 including a P-channel MOSFET 1108 and an N-channel MOSFET 1110 connected in series to each other and a second inverter circuit 1191 including a P-channel MOSFET 1109 and an N-channel MOSFET 1111 connected in series to each other. The input terminal In1 of the first inverter circuit 1190 is connected to the output terminal out2 of the second inverter circuit 1191 via a first input line 1107a, which is connected to the data line 1136. The output terminal out1 of the first inverter circuit 1190 is connected to the input terminal in2 of the second inverter circuit 1191 via a second input line 1107b, which is connected to the data line 1135. The sense circuit 1107 further comprises an N-channel MOSFET 1112 for current control. The N-channel MOSFET 1112 is in an on state when a sense enable line SEN 1187 is at a high level, thereby actuating the sense operation of the sense circuit 1107.

A buffer circuit 1118 is used for writing a data in the memory cell 1103. When a write enable line WEN 1139 is at a high level, a data supplied through an input line 1138 is written in the memory cell 1103 via the pair of the data lines 1135 and 1136 and a predetermined bit line pair (for example, bit lines 1132 and 1138).

A selector circuit 1105 selects the bit line pair of one of the memory cell arrays 1101 and 1102. A read circuit is composed of the selector circuit 1105 and the latch type sense circuit 1107. The selector circuit 1105 comprises four CMOS transfer gates 1170, 1171, 1172 and 1173, which are connected to the bit lines 1132, 1133, 1182 and 1183, respectively. The selector circuit 1105 also comprises four pairs of P-channel MOSFETs and N-channel MOSFETs (control transistors), 1141 and 1142, 1143 and 1144, 1145 and 1146, and 1147 and 1148. The two MOSFETs in each pair are connected to each other at their sources and drains.

In the two CMOS transfer gates 1170 and 1171 of the selector circuit 1105 connected to the pair of bit lines 1132 and 1133, the gates (control electrodes) of the respective N-channel MOSFETs 1142 and 1144 are connected to a selector signal line CSL 1160, and the gates (control electrodes) of the P-channel MOSFETs 1141 and 1143 are connected to another selector signal line XCSL 1161. Similarly, in the other two CMOS transfer gates 1172 and 1173 connected to the other pair of bit lines 1182 and 1183, the gates (control electrodes) of the N-channel MOSFETs 1146 and 1148 are connected to a selector signal line CSR 1162, and the gates (control electrodes) of the P-channel MOSFETs 1145 and 1147 are connected to still another selector signal line XCSR 1163.

Now, a circuit for setting the potentials of the selector signal lines CSL, CSR, XCSL and XCSR will be described. This circuit is constituted with a buffer circuit 1150 for a column address input line ADR 1134.

The configuration of the buffer circuit (potential control means) 1150 will now be described. The buffer circuit 1150 has an address input line A and a write control signal input line W, and also has an output line NOUT connected to the selector signal line CSL 1160 and another output line POUT connected to the selector signal line XCSL 1161.

The output line NOUT is connected to a P-channel MOSFET 1152 for pull-up, an N-channel MOSFET 1153 for pull-up and an N-channel MOSFET 1154 for pull-down. When the potential of the address input line 1134 is at a high level and a write operation is conducted (i.e., when the potential of the write enable line WEN is at a high level), the P-channel MOSFET 1152 for pull-up is turned on, thereby pulling up the potential of the output line NOUT to be equal to the supply voltage VDD. When the potential of the address input line 1134 is at a high level and a read operation is conducted (i.e., when the potential of the write enable line WEN is at a low level), the N-channel MOSFET 1153 for pull-up is turned on, thereby pulling up the potential of the output line NOUT, that is, the potential of the selector signal line CSL 1160, to an intermediate potential that is lower than the supply voltage VDD by the threshold voltage Vtn of the N-channel MOSFET 1153, i.e., VDD–Vtn. When the supply voltage VDD is assumed to be 3.3 V and the threshold voltage Vtn of the N-channel MOSFET 1153 is assumed to be 0.7 V, the potential of the selector signal line CSL 1160 attains an intermediate potential of approximately 2.3 V because the threshold voltage Vtn is raised to approximately 1.0 V owing to the body bias effect. When the address input line 1134 is at a low level, the N-channel MOSFET 1154 for pull-down is turned on, thereby pulling down the potential of the output line NOUT to be equal to the ground voltage VSS.

Also in the buffer circuit 1150, the output line POUT is connected to a P-channel MOSFET 1156 for pull-up, an N-channel MOSFET 1157 for pull-down and an N-channel MOSFET 1155 for pull-up. When the potential of the address input line 1134 is at a high level and a read operation is conducted (i.e., when the potential of the write enable line WEN is at a high level), the N-channel MOSFET 1157 for pull-down is turned on, thereby pulling down the potential of the output line POUT to be equal to the ground voltage VSS. When the potential of the address input line 1134 is at a high level and a read operation is conducted (i.e., when the potential of the write enable line WEN is at a low level), the N-channel MOSFET 1155 for pull-up is turned on, thereby pulling up the potential of the output line POUT, that is, the potential of the selector signal line XCSL 1161, to the intermediate potential (VDD−Vtn=2.3 V) as described above with regard to the output line NOUT. When the address input line 1134 is at a low level, the P-channel MOSFET 1156 for pull-up is turned on, thereby pulling up the potential of the output line POUT to be equal to the supply voltage VDD.

The buffer circuit 1150 is further provided with a P-channel MOSFET (equalizing means) 1158. The P-channel MOSFET 1158 is used, when a data is read immediately after a write operation from the same memory cell array as that used in the previous write operation, for the purpose of quickly pulling down the potential of the selector signal line, which is set to be equal to the supply voltage VDD, to a predetermined intermediate potential. For example, when it is assumed that the potential of the selector signal line CSL 1160 is set to be equal to the supply voltage VDD in a write operation and that a data is read immediately after the write operation, the potential of the selector signal line CSL 1160 set at the supply voltage VDD is equalized with the potential of the selector signal line XCSL 1161 set at the ground voltage VSS by means of the P-channel MOSFET 1158, thereby setting the potential of the selector signal line CSL 1160 at the intermediate potential. A state transition detection circuit 1170 is provided to supply the gate of the P-channel MOSFET 1158 with a control voltage. When the potential of the write enable line WEN 1139 undergoes a high to low transition, the state transition detection circuit 1170 generates a pulse voltage, so that the selector signal lines CSL 1160 and XCSL 1161 are equalized during the generation of the pulse voltage. Then, the potential is pulled up to the intermediate potential (VDD−Vtn) by using the N-channel MOSFET 1155.

Another buffer circuit 1151 having the same configuration as the buffer circuit 1150 is also provided. The buffer circuit 1151 is operated, when the column address signal line ADR is at a low level, for setting the potentials of the selector signal lines CSR 1162 and XCSR 1163 in accordance with a read or write operation.

Figure 12:
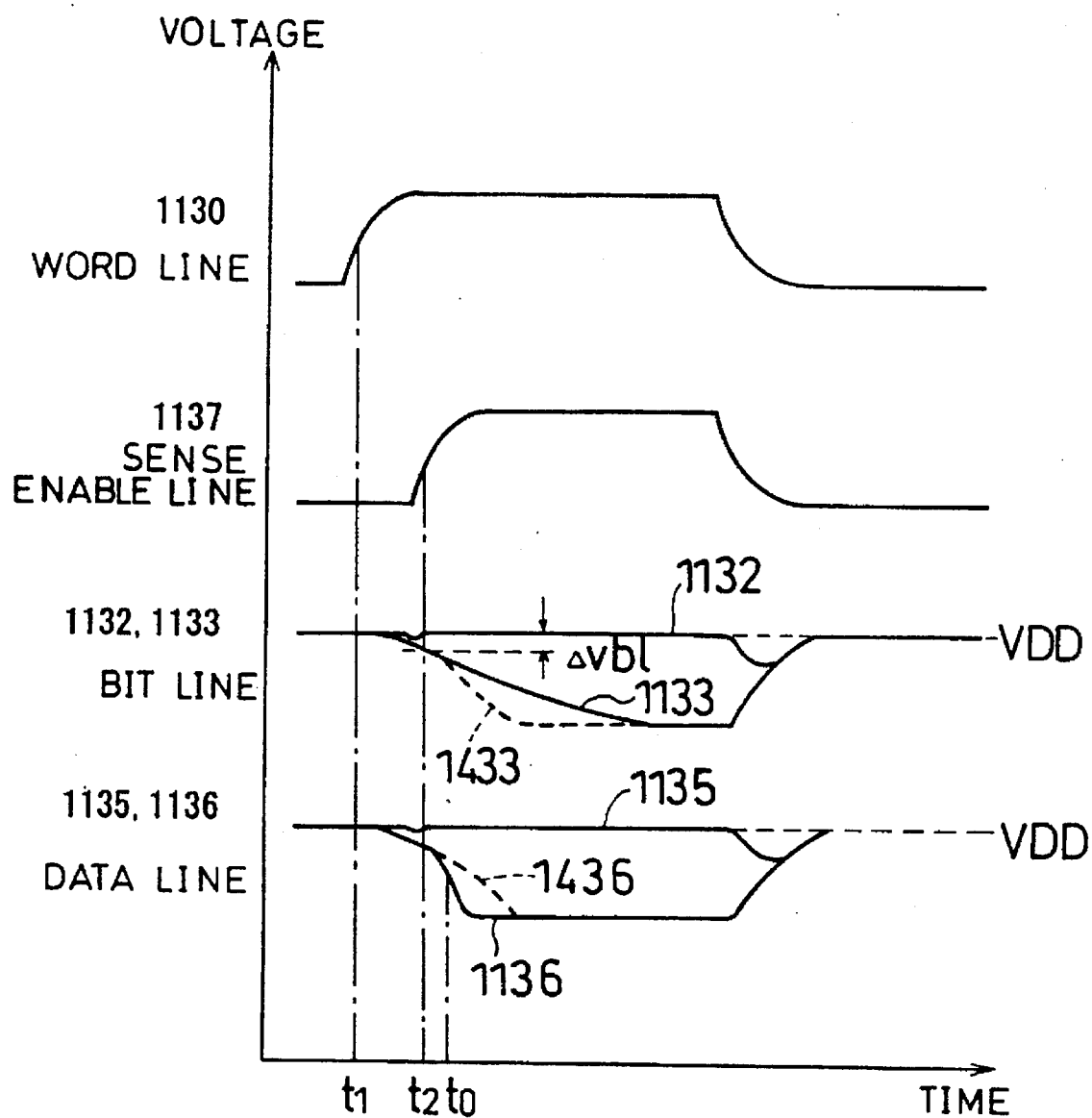
FIG. 12 is a timing chart of the operation of the read circuit of FIG. 11.
Figure 14:
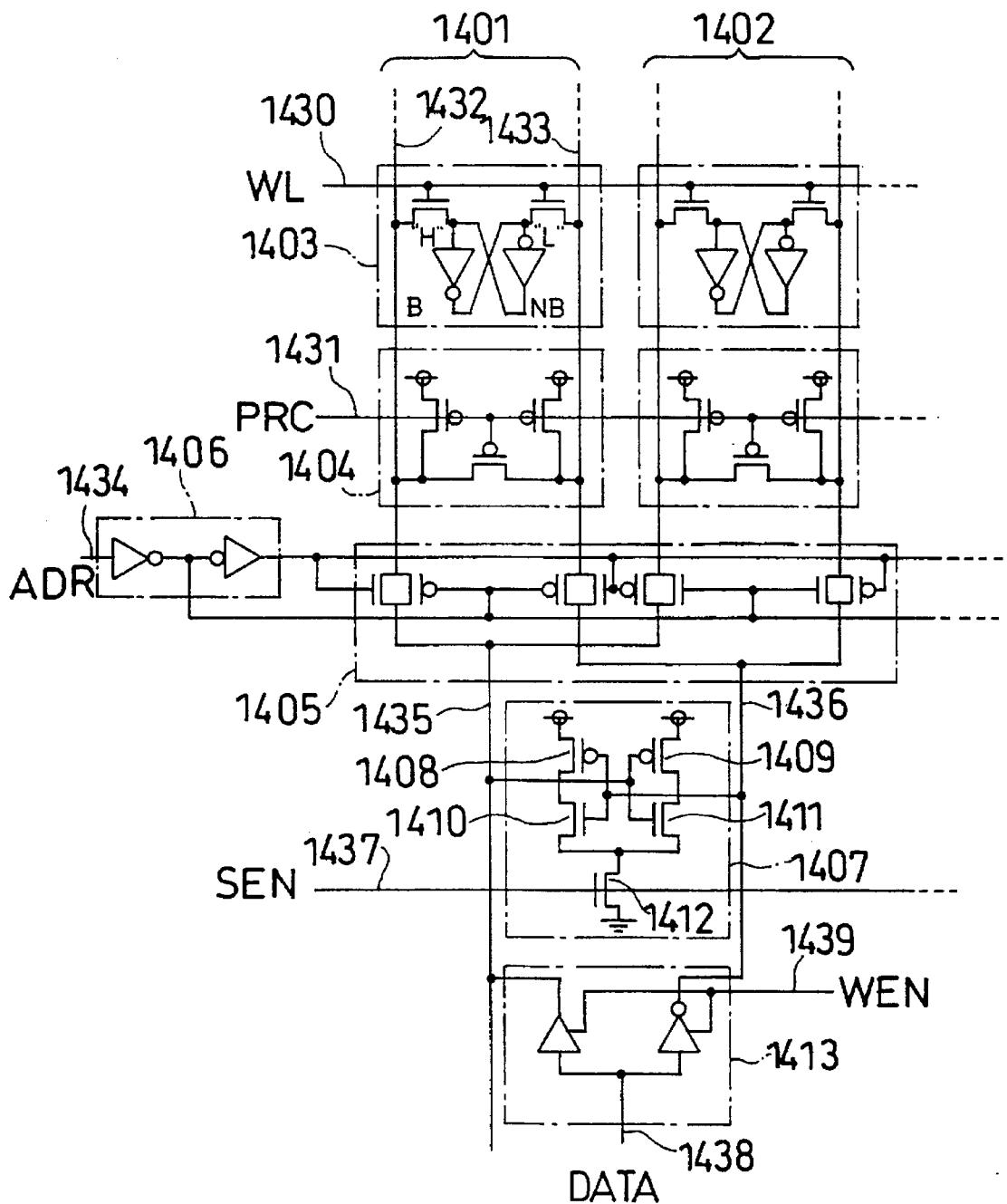
FIG. 14 is a diagram showing the main part configuration of a conventional read circuit for a RAM.
Figure 15:
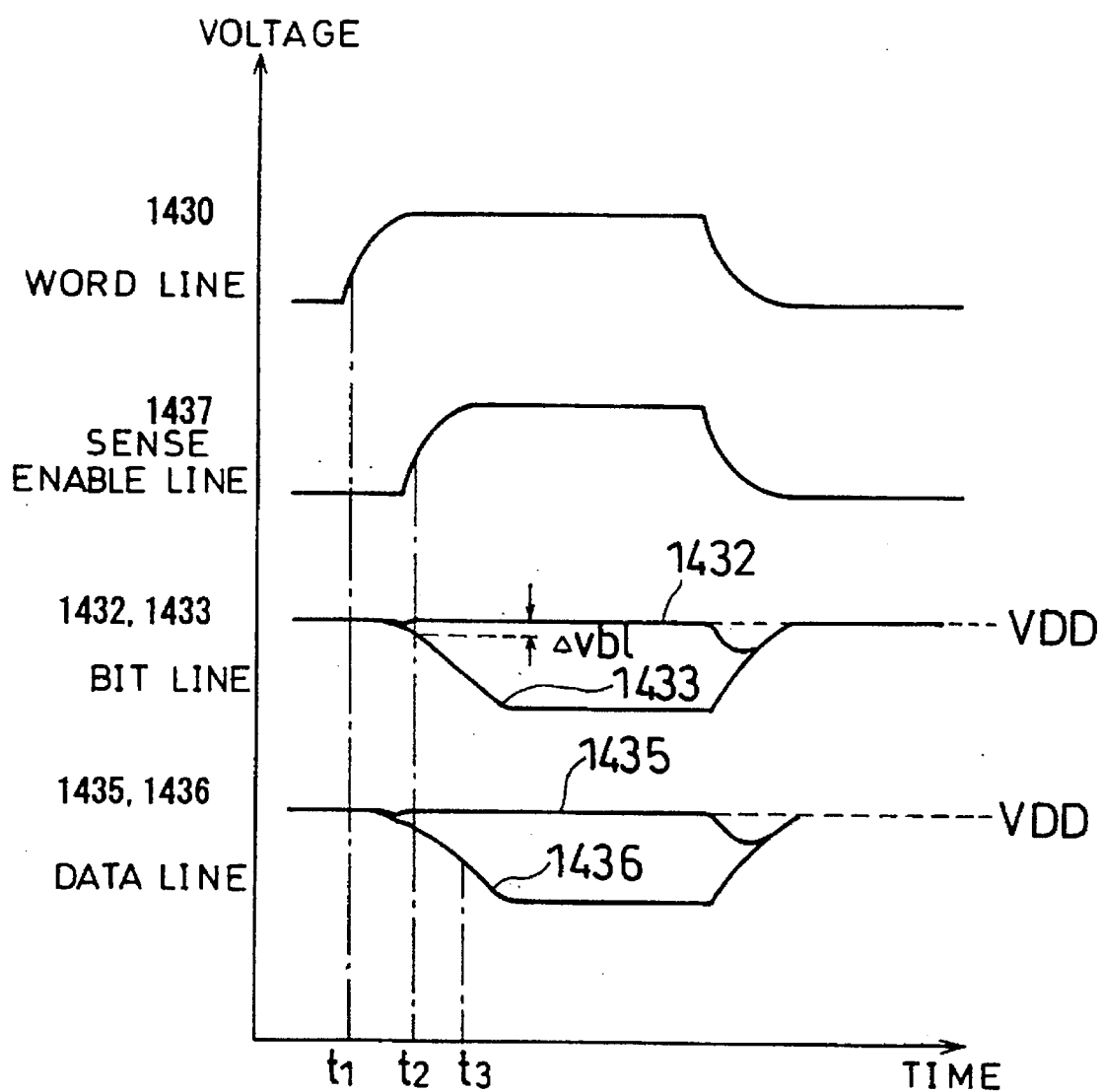
FIG. 15 is a timing chart of the operation of the conventional read circuit for a RAM.

Next, the RAM read operation of the read circuit of this embodiment will be described referring to an operation timing chart of FIG. 12. The description will be made based on the formula 2 for the on condition of a MOSFET, and the formula 3 for the saturation operation condition described in Embodiment 1. In FIG. 12, waveforms of the potentials corresponding to the signal lines shown in the read circuit of FIG. 11 are referred to by the same reference numerals as those used in FIG. 11. The potential waveforms of the conventional circuit of FIG. 14 are also shown in FIG. 12 for comparison.

The potential of the bit line 1133 is indicated as Vb, that of the data line 1136, that is, the output of the selector circuit 1105, as Va, that of the selector signal line XCSL 1161 (i.e., the gate potential of the P-channel MOSFET 1143) as Vgp, and the threshold voltage of the P-channel MOSFET 1143 as Vtp. The potential Vb of the bit line 1133 and the potential Va of the data line 1136 are varied in accordance with a data read operation, time periods at which one or both of the formulas 2 and 3 are satisfied are varied in accordance with the potential variation.

It is assumed that the potential of the column address input line 1134 is set at a high level, that the bit lines 1132 and 1133 of the memory cell array 1101 are selected by the selector circuit 1105, and that the memory cell 1103 stores a data of a logic value of "1". Since the potential of the bit line 1132 is previously set to be a precharge potential and the memory cell 1103 is not discharged, the potential of the bit line 1132 is not varied.

At the initial stage of the data read operation, when the potential of the word line 1130 undergoes a low to high transition at time t1, the bit line 1133 is discharged by the memory cell 1103 to a low level, and the bit line 1132 outputs a signal at a high level.

At this point, the voltage between the gate and the source and the voltage between the source and the drain of the P-channel MOSFET 1143 are represented by the following formulas 12 and 13, respectively:

Formula 12:

$$Vgs=Va-Vgp$$

Formula 13:

$$Vds=Va-Vb$$

Substitution of the formulas 12 and 13 in the formulas 2 and 3 described in Embodiment 1 and simplification of the resultant formulas provide the following formulas 14 and 15 as the on condition and the saturation operation condition for the P-channel MOSFET 1143, respectively:

Formula 14:

$$Vgp \leq Va-Vtp$$

Formula 15:

$$Vgp \geq Vb-Vtp$$

Now, examples of actual numerical values will be used for the description as in Embodiment 1. Also in this embodiment, it is assumed that the supply voltage VDD is 3.3 V and that the threshold voltage Vtp of the P-channel MOSFET 1143 is 0.7 V. Then, the potential of the selector signal line XCSL 1161, i.e., the gate potential Vgp of the P-channel MOSFET 1143, is 2.3 V as described above. Therefore, the formula 14 for the on condition is satisfied but the formula 15 for the saturation operation condition is not satisfied, the P-channel MOSFET 1143 is operated in the linear region.

In contrast, the N-channel MOSFET 1144 is operated as follows: When the potential of the selector signal line CSL 1160, i.e., the gate potential of the N-channel MOSFET 1144, is indicated as Vgn and the threshold voltage thereof is indicated as Vtn, the voltage between the gate and the source and the voltage between the source and the drain of the N-channel MOSFET 1144 are represented by the following formulas 16 and 17, respectively:

Formula 16:

$$Vgs = Vgn - Va$$

Formula 17:

$$Vds = Vb - Va$$

At this point, merely the case where the potential Vb of the bit line 1133 is higher than the potential Va of the data line is presumed because of the restriction of the on condition described in detail below. Substitution of the formulas 16 and 17 in the formulas 2 and 3 and simplification of the resultant formulas provide the following formulas 18 and 19 as the on condition and the saturation operation condition of the N-channel MOSFET 1144, respectively:

Formula 18:

$$Vgn \geq Va + Vtn$$

Formula 19:

$$Vgn \leq Vb + Vtn$$

In this embodiment, the threshold voltage Vtn of the N-channel MOSFET 1144 is assumed to be 0.7 V. The gate potential Vgn of the N-channel MOSFET is 2.3 V as described above. Therefore, the formula 19 for the saturation operation condition is satisfied but the formula 18 for the on condition is not satisfied, the N-channel MOSFET 1144 is in an off state.

Then, when the potential Vb of the bit line 1133 is lowered to be 3.0 V, the formula 15 for the saturation operation condition is satisfied, the P-channel MOSFET 1143 starts to be operated in the saturation region. Thus, the impedance between the bit line 1133 and the data line 1136 becomes substantially infinity, and these lines are substantially open-circuited.

When a potential difference ΔVb1 between the bit lines 1132 and 1133 becomes a predetermined potential at time t2, the potential of the sense enable line 1137 undergoes a low to high transition. The sense circuit 1107 works as a latch circuit, and is balanced when the potentials of the data lines 1135 and 1136 are equal. When the potential difference ΔVb1 occurs between the bit lines 1132 and 1133, the sense circuit 1107 amplifies the potential difference ΔVb1, thereby amplifying the potential of the data line 1135 at a high level to be equal to the supply voltage VDD and the potential of the data line 1136 at a low level to be equal to the ground voltage VSS. As described above, the P-channel MOSFET 1143 is operated in the saturation region, the bit line 1133 and the data line 1136 are substantially open-circuited, and the data line 1136 is separated from the bit line 1133 having a large load (a sum of a wire capacitance, a wire resistance, a drain capacitance of the memory cell 1103 and the like). As a result, as is shown in FIG. 12, the bit line 1133 outputting a signal at a low level is discharged through almost the N-channel MOSFET of the memory cell 1103 alone. Therefore, unlike the conventional circuit of FIG. 14 (which is shown with a broken line as the potential variation of the bit line 1433 in FIG. 12), the potential is gently varied in the present circuit. The latch type sense circuit 1107 discharges merely the data line 1136 having a small load capacitance, the potential of the data line 1136 is rapidly decreased. This potential variation is steeper than that of the conventional circuit of FIG. 14 (which is shown with a broken line as the potential variation of the bit line 1436), and results in faster data reading.

Then, as the data line 1136 is discharged, the potential Va of the data line 1136 becomes lower than the potential Vb of the bit line 1133. At this point, the voltage between the gate and the source and the voltage between the source and the drain of the P-channel MOSFET 1143 are represented by the following formulas 20 and 21, respectively:

Formula 20:

$$Vgs = Vb - Vgp$$

Formula 21:

$$Vds = Vb - Va$$

Substitution of the formulas 20 and 21 in the formulas 2 and 3 and simplification of the resultant formulas provide the following formulas 22 and 23 as the on condition and the saturation operation condition for the P-channel MOSFET 1143, respectively:

Formula 22:

$$Vgp \leq Vb - Vtp$$

Formula 23:

$$Vgp \geq Va - Vtp$$

At this point, since the formula 18 for the on condition is not satisfied any more, the P-channel MOSFET 1143 is turned off.

When the potential Va of the data line 1136 is further decreased by the discharge to be lower than 1.6 V, the formula 18 for the on condition is satisfied and hence the N-channel MOSFET 1144 is operated in the saturation region. Therefore, the impedance between the bit line 1133 and the data line 1136 becomes substantially infinity, and these signal lines are substantially open-circuited. Thus, the charge of the data line 1136 is discharged through the sense circuit 1107, while being separated from the bit line 1133.

At time t0, the potential of the data line 1136 becomes lower than a logical threshold value of a subsequent circuit (not shown), and thus a data to be read is defined.

Then, when the potential Vb of the bit line 1133 also becomes lower than 1.6 V by the discharge of the memory cell 1103, the formula 19 for the saturation operation condition is not satisfied any more, the N-channel MOSFET 1144 is operated in the linear region having a small impedance. However, since the potential Va of the data line 1136 has already been defined and the read operation is completed, there arises no problem.

In this manner, in most part of the read operation, the impedance between the data line 1136 and the bit line 1133 is substantially infinity, so that the load capacitance driven by the sense circuit 1107 can be as small as the capacitance of the data line 1136 alone. Accordingly, the read operation can be performed at a high speed.

In the write operation, the gate potential of the P-channel MOSFET 1143 is set at the ground voltage VSS by the selector signal line XCSL 1161 and the gate potential of the N-channel MOSFET 1144 is set at the supply voltage VDD by the selector signal line CSL 1160. Therefore, the voltages between the gates and the sources of the P-channel MOSFET 1143 and the N-channel MOSFET 1144 can be maximized, thereby minimizing the on resistances thereof.

As a result, the data write time can be shortened, thereby realizing a fast write operation.

The potentials of the word line 1130, the precharge enable line 1131 and the sense enable line 1137 are operated at clock timing of substantially the same phase. Therefore, when the potential of the word line 1130 undergoes a high to low transition, the potentials of the precharge enable line 1131 and the sense enable line 1137 also undergo a high to low transition. Thus, the bit lines 1132 and 1133 and the data lines 1135 and 1136 are separated from the sense circuit 1107 while precharging/equalizing.

Figure 13:
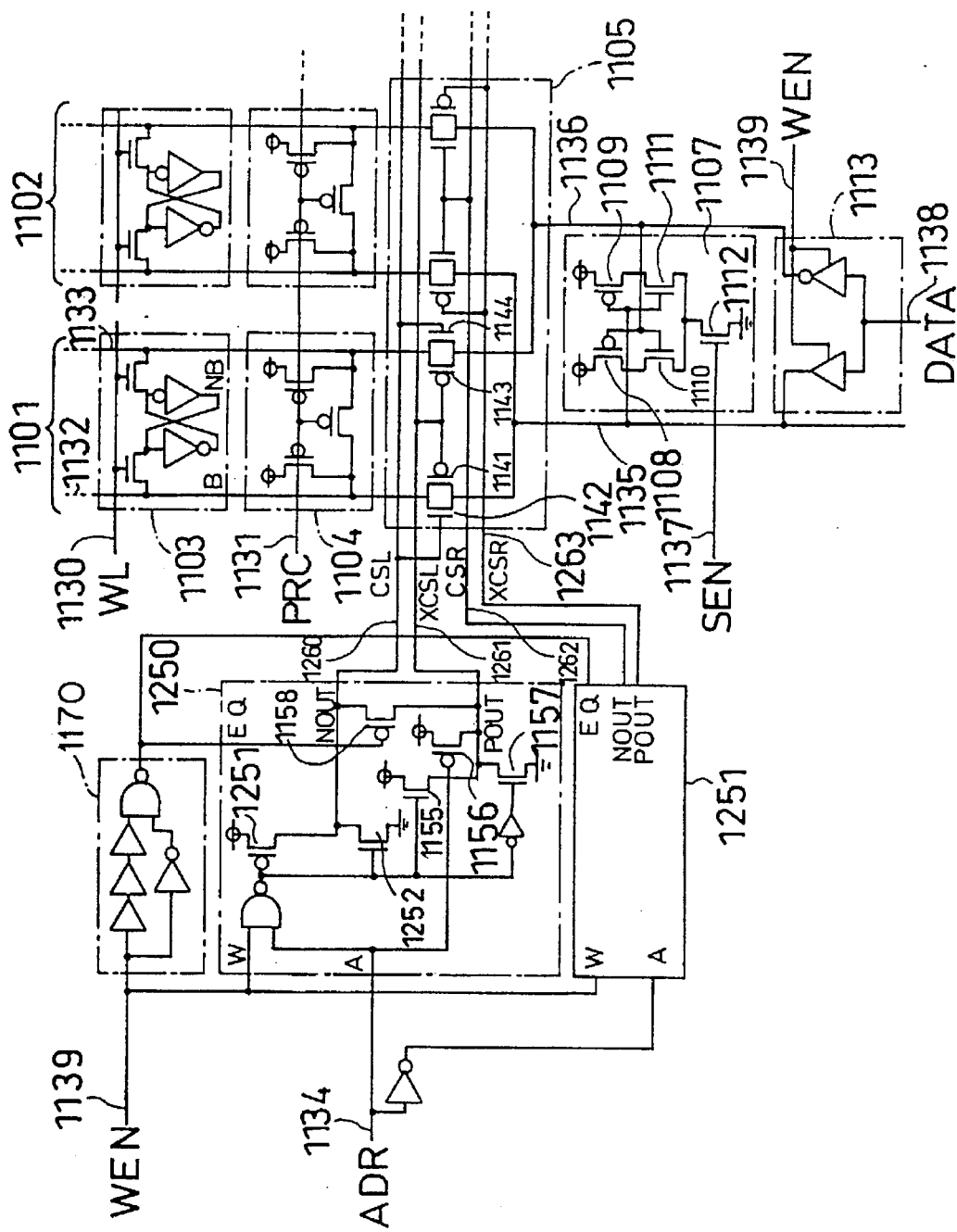
FIG. 13 is a diagram showing the main part configuration of a read circuit for a RAM according to a seventh embodiment of the invention.

Embodiment 7:

FIG. 13 shows the main part configuration of a read circuit for a RAM according to a seventh embodiment of the invention. Like reference numerals are used to refer to like elements shown in FIG. 11, and the description is omitted.

This embodiment is partial improvement of Embodiment 6 as follows: The four N-channel MOSFETs 1142, 1144, 1146 and 1148 included in the selector circuit 1105 are in an off state at the initial stage of a read operation as described regarding Embodiment 6. They start to be operated in the saturation region after the formulas 18 and 19 are satisfied at predetermined time in the latter half of the operation. Therefore, in this embodiment, the four N-channel MOSFETs are controlled to be always in an off state in a read operation.

As is shown in FIG. 13, a buffer circuit (potential control means) 1250 for a column address input line has an address input line A and a write control signal input line W, and also has an output line NOUT connected to a selector signal line CSL 1260 and an output line POUT connected to a selector signal line XCSL 1261. When the potential of an address input line 1134 is at a high level and a write operation is conducted (i.e., when the potential of a write enable line WEN is at a high level), the output line NOUT attains a supply voltage VDD by turning on a P-channel MOSFET 1251 for pull-up. When the potential of the address input line 1134 is at a high level and a read operation is conducted (i.e., when the potential of the write enable line WEN is at a low level), and when the potential of the address input line 1134 is at a low level, the output line NOUT attains a ground voltage VSS by turning on an N-channel MOSFET 1252 for pull-down. Unlike the buffer circuit 1150 of FIG. 11, the N-channel MOSFET 1153 for generating an intermediate potential is omitted. The configuration for setting the potential of the output line POUT is identical to that of the buffer circuit 1150 of FIG. 11. A buffer circuit 1251 has the same configuration as the buffer circuit 1250.

Thus, in this embodiment, when a read operation is conducted, for example, with bit lines 1132 and 1133 selected, although two N-channel MOSFETs 1142 and 1144 in a selector circuit 1105 are always in an off state, two P-channel MOSFETs 1141 and 1143 are operated in the saturation region. Therefore, the bit lines 1132 and 1133 are substantially open-circuited to data lines 1135 and 1136. As a result, a latch type sense circuit 1107 discharges merely the data lines 1135 and 1136 with a small load capacitance, thereby realizing a fast read operation. In addition, since the N-channel MOSFET 1153 for generating an intermediate potential as used in the circuit of FIG. 11 is not provided, the configuration of the buffer circuit 1250 can be effectively simplified. In a write operation, the MOSFETs of the selector circuit 1105 are operated in the linear region as in Embodiment 6, a data can be transferred to a memory cell at a low impedance, thereby realizing a fast write operation.

Although a MOSFET is used as a transistor in the aforementioned embodiments, it goes without saying that the MOSFET can be replaced with a bipolar transistor, a GaAs MESFET and the like, which can be operated similarly.

What is claimed is:

1. A data read circuit used in a semiconductor storage device including a dynamic circuit having a first data line that is precharged to a predetermined potential in a precharge period and is connected to a plurality of memory cells, comprising:

a second data line that is precharged to a predetermined potential in the precharge period;

current supply means connected to the first data line for detecting potential variation of the first data line and supplying a current in response to detection of the potential variation;

a current mirror circuit including a current input terminal for receiving the current from the current supply means and a current output terminal connected to the second data line, for receiving the current from the current supply means as a reference current, so as to allow a current to flow from the current output terminal to the ground, thereby discharging the second data line;

a control transistor for connecting the first data line to the second data line; and open control means for, during an operation of the current mirror circuit to allow the current to flow, setting a potential of a control electrode of the control transistor at an intermediate potential which allows the control transistor to be operated in a saturation region, so as to make the first data line and the second data line substantially open-circuited.

2. The data read circuit used in a semiconductor storage device of claim 1, further comprising:

an inverter circuit connected to the second data line at an input port thereof and having an output line for outputting a potential obtained by logically inverting a potential of the second data line; and supply current amount control means connected to the output line of the inverter circuit for controlling an amount of the current supplied by the current supply means to be small after potential variation of the output line is completed.

3. The data read circuit used in a semiconductor storage device of claim 2, wherein the supply current amount control means includes a P-channel MOSFET interposed between the current supply means and the current input terminal of the current mirror circuit, and a gate of the P-channel MOSFET is connected to the output line of the inverter circuit.

4. The data read circuit used in a semiconductor storage device of claim 2, wherein the supply current amount control means includes a P-channel MOSFET interposed between the current mirror circuit and the ground, and a gate of the P-channel MOSFET is connected to the output line of the inverter circuit.

5. The data read circuit used in a semiconductor storage device of claim 1, further comprising supply current amount control means connected to the second data line for controlling an amount of the current supplied by the current supply means to be small after potential variation of the second data line is completed.

6. The data read circuit used in a semiconductor storage device of claim 5, wherein the supply current control means includes an N-channel MOSFET interposed between the current supply means and the current input terminal of the current mirror circuit, and a gate of the N-channel MOSFET is connected to the second data line.

7. The data read circuit used in a semiconductor storage device of claim 5, wherein the supply current amount control means includes an N-channel MOSFET interposed between the current mirror circuit and the ground, and a gate of the N-channel MOSFET is connected to the second data line.

8. The data read circuit used in a semiconductor storage device of claim 1, further comprising separation means for forcibly setting a potential of the current input terminal of the current mirror circuit at a ground voltage in the precharge period of the second data line, so as to separate the second data line from the current output terminal of the current mirror circuit.

9. The data read circuit used in a semiconductor storage device of any of claims 1, 2, 3, 4, 5, 6, 7 and 8, wherein the current mirror circuit includes a first transistor interposed between the current input terminal and a ground line and connected to the current input terminal at a control electrode thereof; and a second transistor interposed between the current output terminal and the ground line and connected to the current input terminal at a control electrode thereof.

10. The data read circuit used in a semiconductor storage device of claim 9, wherein the first and the second transistors are constituted with N-channel MOSFETs, respectively.

11. The data read circuit used in a semiconductor storage device of any of claims 1, 2, 3, 4, 5, 6, 7 and 8, wherein the current supply means includes a P-channel MOSFET, and the P-channel MOSFET is connected to the first data line at a gate thereof, and to a power supply line at a source thereof, and a current from a drain thereof is used as the current supplied by the current supply means.

12. A data read circuit used in a semiconductor storage device, the semiconductor storage device being provided with a bit line pair including two bit lines to which a memory cell is connected;

the data read circuit comprising:

a data line pair including two data lines and connected to the bit line pair, so that a data is read from the memory cell via the bit line pair to the data line pair in a data read operation and a data is written in the memory cell from the data line pair via the bit line pair in a data write operation;

the data read circuit comprising:

a latch type sense circuit connected to the data line pair for reading a data stored in the memory cell from the bit line pair to the data line pair;

control transistors interposed between the bit line pair and the data line pair; and potential control means connected to control electrodes of the respective control transistors for controlling potentials of the control electrodes, wherein, in a data read operation where the latch type sense circuit is operated, the potential control means sets the potentials of the control electrodes of the control transistors at an intermediate potential that is smaller than a supply voltage but exceeds a ground voltage so as to operate the control transistors in a saturation region; and in the data write operation, the potential control means sets the potentials of the control electrodes of the control transistors at potentials which allow the control transistors to be operated in a linear region.

13. The data read circuit used in a semiconductor storage device of claim 12, wherein the latch type sense circuit includes:

a first inverter circuit and a second inverter circuit each having an input terminal and an output terminal;

a first input line for connecting the input terminal of the first inverter circuit to the output terminal of the second inverter circuit; and a second input line for connecting the output terminal of the first inverter circuit to the input terminal of the second inverter circuit, and the first input line and the second input line form an input line pair to be connected to the data line pair.

14. A data read circuit used in a semiconductor storage device the semiconductor storage device being provided with plural bit line pairs to which memory cells are connected and each bit line pair including two bit lines;

the data read circuit comprising;

a selector circuit which selects one pair of the bit line pairs among the corresponding plural bit line pairs for data read and write operations and includes CMOS transfer gates in the same number of the bit lines included in the plural bit line pairs, each of the CMOS transfer gates including a P-channel MOSFET and an N-channel MOSFET which are connected to each other at sources and drains thereof and the CMOS transfer gates being connected to the corresponding bit lines, a data line pair including two data lines which connected to each of the CMOS transfer gates, so that a data is read from the memory cell via the bit line pair to the data line in a data read operation and a data is written in the memory cell from the data line pair via the bit line pair in a data write operation;

a latch type sense circuit connected to the data line pair for reading a data stored in the memory cell from the bit line pair to be selected by the selector circuit among the plural bit line pairs to the data line pair; and potential control means connected to respective gate electrodes of the MOSFETs of CMOS transfer gates for controlling potentials of the gate electrodes, wherein, in a data read operation where the latch type sense circuit is operated, the potential control means sets the potentials of the gate electrodes of two MOSFETs of CMOS transfer gates which are correspondingly connected to the bit line pair to be selected by the selector circuit at an intermediated potential that is smaller than a supply voltage but exceeds a ground voltage so as to operate the MOSFETs in a saturation region, and in the data write operation, the potential control means sets the potentials of the gate electrodes of two MOSFETs of CMOS transfer gates which are correspondingly connected to the bit line pair to be selected by the selector circuit at potentials which allow the MOSFETs to be operated in a linear region.

15. The data read circuit used in a semiconductor storage device of claim 14, wherein, in a read operation where predetermined one bit line pair is selected, the potential control means sets a gate potential of each of the two P-channel MOSFETs and the two N-channel MOSFETs included in the two CMOS transfer gates connected to the selected predetermined bit line pair at an intermediate potential which is smaller than a supply voltage but exceeds a ground voltage, so that the four MOSFETs are operated in a saturation region, and in a write operation where predetermined one bit line pair is selected, the potential control means sets a gate potential of each of the two P-channel MOSFETs included in the two CMOS transfer gates connected to the selected predetermined bit line pair at a ground voltage and sets a gate potential of each of the two N-channel MOSFETs included in the two CMOS transfer gates at a supply voltage, so that the four MOSFETs are operated in a linear region.

16. The data read circuit used in a semiconductor storage device of claim 14, wherein, in a read operation where predetermined one bit line pair is selected, the potential control means sets a gate potential of each of the two P-channel MOSFETs included in the two CMOS transfer gates connected to the selected predetermined bit line pair at an intermediate potential which is smaller than a supply voltage but exceeds a ground voltage, so that the two P-channel MOSFETs are operated in a saturation region, and sets a gate potential of each of the two N-channel MOSFETs included in the two CMOS transfer gates at a ground voltage, so that the two N-channel MOSFETs are turned off, and in a write operation where predetermined one bit line pair is selected, the potential control means sets a gate potential of each of the two P-channel MOSFETs included in the two CMOS transfer gates connected to the selected predetermined bit line pair at the ground voltage and sets a gate potential of each of the two N-channel MOSFETs included in the two CMOS transfer gates at the supply voltage, so that the four MOSFETs are operated in a linear region.

17. The data read circuit used in a semiconductor storage device of claim 15, wherein, in the two CMOS transfer gates connected to the selected bit line pair, the gates of the two P-channel MOSFETs included in the two CMOS transfer gates are commonly connected to a selector signal line and the gates of the two N-channel MOSFETs included in the two CMOS transfer gates are commonly connected to another selector signal line, and the potential control means includes equalizing means for equalizing these selector signal lines when a data is read via the same bit line pari immediately after the write operation using the bit line pair.

* * * * *

UNITED STATES PATENT AND TRADEMARK OFFICE
CERTIFICATE OF CORRECTION

PATENT NO. : 5,671,181
DATED : September 23, 1997
INVENTOR(S) : Hatsuda

It is certified that error appears in the above-identified patent and that said Letters Patent is hereby corrected as shown below:

Claim 12, line 13, delete "the data read circuit comprising:".

Claim 17, line 12, change "pari" to --pair--.

Signed and Sealed this

Twenty-seventh Day of June, 2000

Attest:

Q. TODD DICKINSON

*Attesting Officer*  *Director of Patents and Trademarks*